US011245002B2

(12) United States Patent
Weis et al.

(10) Patent No.: US 11,245,002 B2
(45) Date of Patent: Feb. 8, 2022

(54) SUPERJUNCTION TRANSISTOR ARRANGEMENT AND METHOD OF PRODUCING THEREOF

(71) Applicant: Infineon Technologies Dresden GmbH & Co. KG, Dresden (DE)

(72) Inventors: Rolf Weis, Dresden (DE); Henning Feick, Dresden (DE); Franz Hirler, Isen (DE); Andreas Meiser, Sauerlach (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/230,183

(22) Filed: Dec. 21, 2018

(65) Prior Publication Data

US 2019/0198609 A1    Jun. 27, 2019

(30) Foreign Application Priority Data

Dec. 22, 2017   (DE) .......................... 102017131274.9

(51) Int. Cl.
*H01L 29/06* (2006.01)
*H01L 29/66* (2006.01)
(Continued)

(52) U.S. Cl.
CPC ........ *H01L 29/0634* (2013.01); *H01L 27/085* (2013.01); *H01L 29/0696* (2013.01); *H01L 29/0869* (2013.01); *H01L 29/0886* (2013.01); *H01L 29/1095* (2013.01); *H01L 29/66681* (2013.01); *H01L 29/66901* (2013.01); *H01L 29/7819* (2013.01); *H01L 29/7823* (2013.01); *H01L 29/808* (2013.01);
(Continued)

(58) Field of Classification Search
CPC ............. H01L 29/0634; H01L 29/0696; H01L 29/1095; H01L 29/808; H01L 29/41766; H01L 29/7816; H01L 29/7825; H01L 29/0869; H01L 29/0886; H01L 29/66681; H01L 29/7819; H01L 29/7823
USPC ......... 257/328, 330, 339, E29.066, E29.256; 438/192, 268, 270
See application file for complete search history.

(56) References Cited

U.S. PATENT DOCUMENTS 5,534,721 A    7/1996 Shibib
6,097,063 A    8/2000 Fujihira
(Continued)

*Primary Examiner* — David Chen
(74) *Attorney, Agent, or Firm* — Murphy, Bilak & Homiller, PLLC

(57) ABSTRACT

A transistor arrangement includes: a layer stack with first and second semiconductor layers of complementary first and second doping types; a first source region of a first transistor device adjoining the first semiconductor layers; a first drain region of the first transistor device adjoining the second semiconductor layers and spaced apart from the first source region; gate regions of the first transistor device, each gate region adjoining at least one second semiconductor layer, being arranged between the first source region and the first drain region, and being spaced apart from the first source region and the first drain region; a third semiconductor layer adjoining the layer stack and each of the first source region, first drain region, and each gate region; and active regions of a second transistor device integrated in the third semiconductor layer in a second region spaced apart from a first region of the third semiconductor layer.

22 Claims, 16 Drawing Sheets

(51) Int. Cl.
    *H01L 27/085*    (2006.01)
    *H01L 29/808*    (2006.01)
    *H01L 29/08*     (2006.01)
    *H01L 29/10*     (2006.01)
    *H01L 29/78*     (2006.01)
    *H01L 29/423*    (2006.01)
    *H01L 29/40*     (2006.01)
    *H01L 29/417*    (2006.01)

(52) U.S. Cl.
    CPC ...... *H01L 29/0619* (2013.01); *H01L 29/0649* (2013.01); *H01L 29/0684* (2013.01); *H01L 29/1075* (2013.01); *H01L 29/405* (2013.01); *H01L 29/41766* (2013.01); *H01L 29/42316* (2013.01)

(56) References Cited

U.S. PATENT DOCUMENTS

| | | |
|---|---|---|
| 9,236,449 B2 | 1/2016 | Ellis-Monaghan et al. |
| 9,312,381 B1 | 4/2016 | Bobde et al. |
| 9,450,045 B1 | 9/2016 | Bobde et al. |
| 9,991,380 B2 | 6/2018 | Bobde et al. |
| 2011/0127586 A1 | 6/2011 | Bobde et al. |
| 2014/0227837 A1* | 8/2014 | Bobde ............... H01L 29/66484 438/192 |
| 2016/0308037 A1* | 10/2016 | Sakata ................ H01L 29/0619 |
| 2017/0092716 A1 | 3/2017 | Mauder et al. |
| 2017/0222043 A1 | 8/2017 | Hirler et al. |

\* cited by examiner

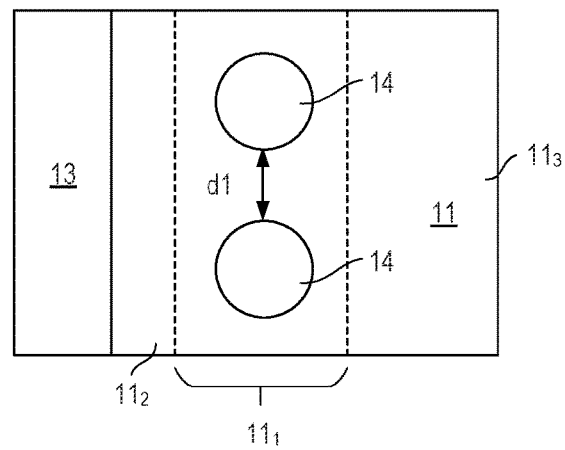
FIG 1C
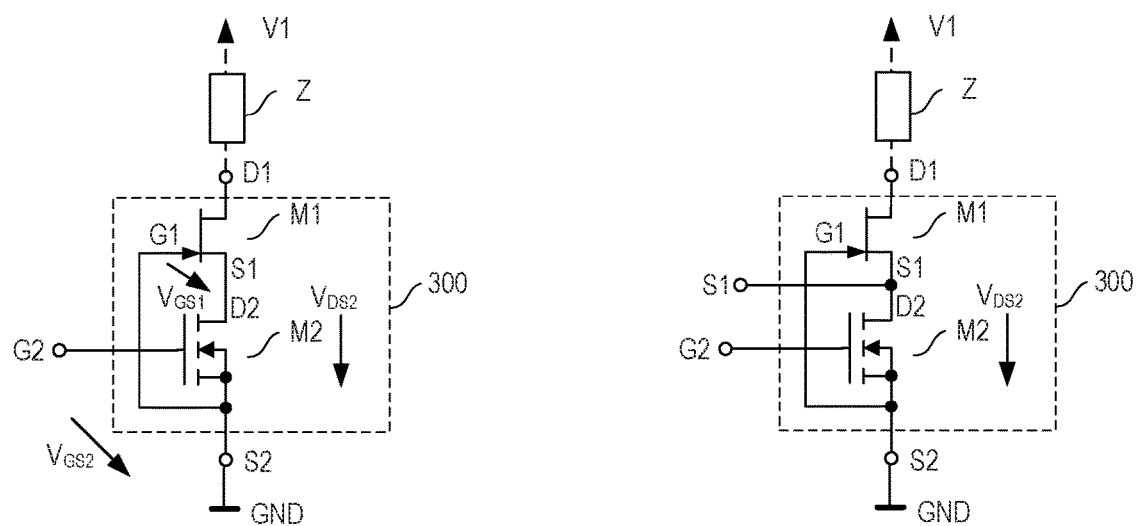
FIG 2A
FIG 2B
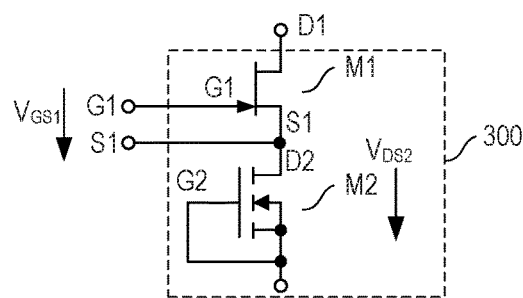
FIG 2C
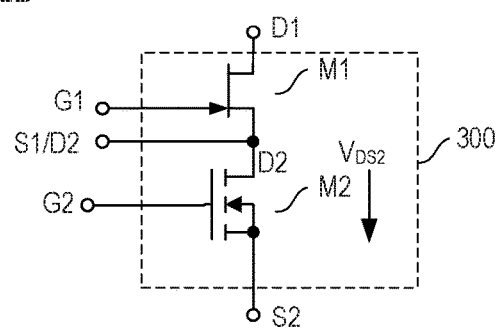
FIG 2D

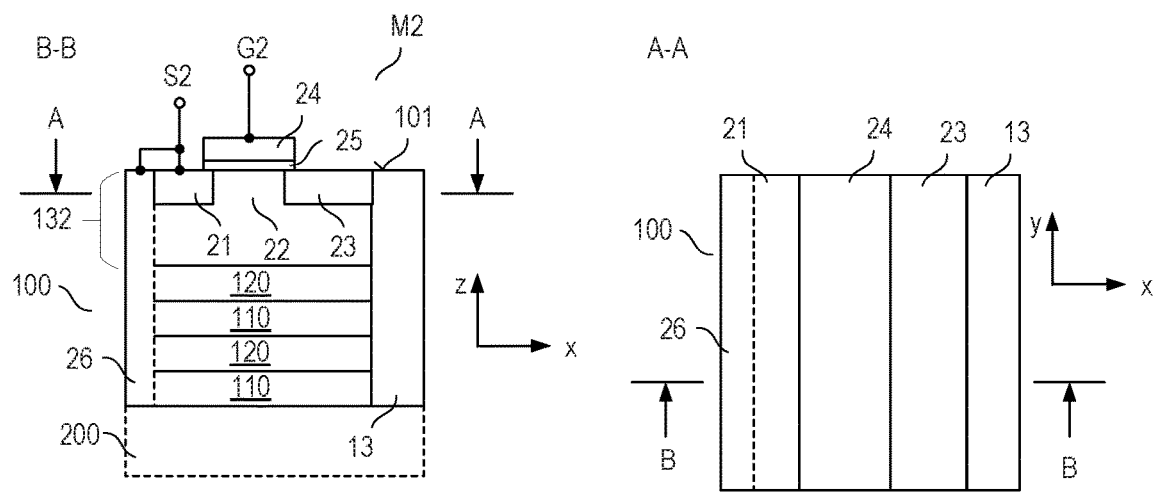
FIG 3A          FIG 3B
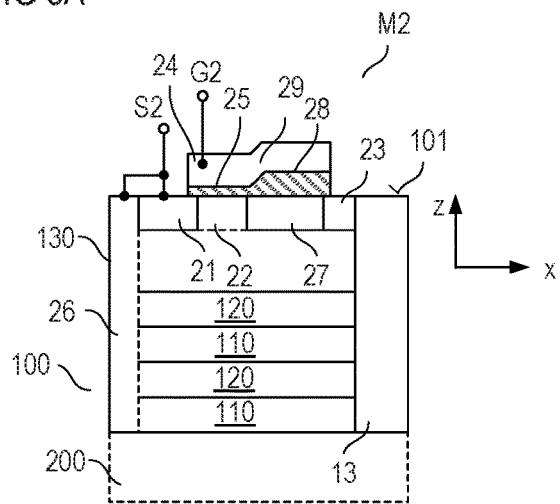     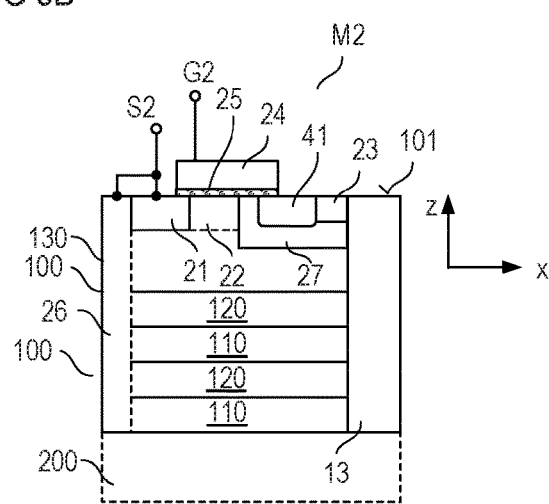
FIG 4           FIG 5
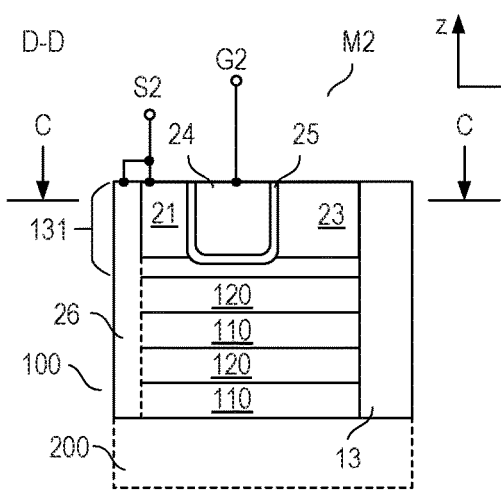     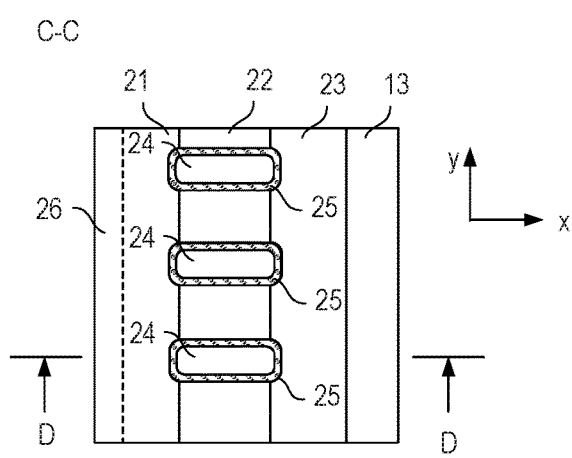
FIG 6A          FIG 6B

US 11,245,002 B2

SUPERJUNCTION TRANSISTOR ARRANGEMENT AND METHOD OF PRODUCING THEREOF

TECHNICAL FIELD

This disclosure in general relates to a transistor arrangement, in particular a transistor arrangement with a lateral superjunction transistor device and a further transistor device.

BACKGROUND

In a transistor arrangement with a lateral superjunction transistor device and a further transistor device the superjunction transistor device may be implemented as depletion device, the further transistor device may be implemented as an enhancement or depletion device and these two transistor devices may be connected such that the further transistor device controls the superjunction transistor device, so that the superjunction transistor device switches on and off controlled by the further transistor device.

It is desirable in this type of transistor arrangement to design the further transistor device widely independent of the design of the superjunction transistor device.

SUMMARY

One example relates to a transistor arrangement. The transistor arrangement includes a layer stack with a plurality of first semiconductor layers of a first doping type and a plurality of second semiconductor layers of a second doping type complementary to the first doping type, a first source region of a first transistor device adjoining the plurality of first semiconductor layers, a first drain region of the first transistor device adjoining the plurality of second semiconductor layers and spaced apart from the first source region in a first direction, and a plurality of gate regions of the first transistor device. Each of the plurality of gate regions adjoins at least one of the plurality of second semiconductor layers, is arranged between the first source region and the first drain region, and is spaced apart from the first source region and the first drain region. A third semiconductor layer adjoins the layer stack and each of the first source region, the first drain region, and the gate regions. Further, active regions of a second transistor device are integrated in the third semiconductor layer in a second region that is spaced apart from a first region, wherein the first region is bordered by the first source region and the first drain region. The first region of the third semiconductor layer has the second doping type.

Another example relates to a method. The method includes forming a semiconductor body on top of a carrier, wherein the semiconductor body comprises a layer stack with a plurality of first layers of a first doping type and a plurality of second layers of a second doping type complementary to the first doping type and a third layer on top of the layer stack. The method further includes forming a first source region of a first transistor device such that the first source region adjoins the plurality of first semiconductor layers, forming a first drain region of the first transistor device such that the first drain region adjoins the plurality of first semiconductor layers and is spaced apart from the first source region in a first direction. The method further includes forming a plurality of gate regions of the first transistor device such that each of the plurality of gate regions adjoins at least one of the plurality of second semiconductor layers, is arranged between the first source region and the first drain region, and is spaced apart from the first source region and the first drain region, and forming active regions of a second transistor device in a second region of the third layer, wherein the second region is spaced apart from a first region, wherein the first region is bordered by the first source region and the first drain region.

BRIEF SUMMARY OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

FIGS. 1A-1C schematically illustrate a perspective sectional view (FIG. 1A), a vertical cross sectional view (FIG. 1B), and a horizontal cross sectional view (FIG. 1C of a transistor arrangement that includes a first transistor device and a second transistor device integrated in one semiconductor body;

FIGS. 2A-2D show equivalent circuit diagrams that illustrate how the first transistor device and the second transistor device in a transistor arrangement of the type shown in FIGS. 1A-1C may be connected;

FIGS. 3A-3B illustrate one example of the second transistor device;

FIGS. 4, 5 and 6A-6B illustrate further examples of the second transistor device;

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1A:
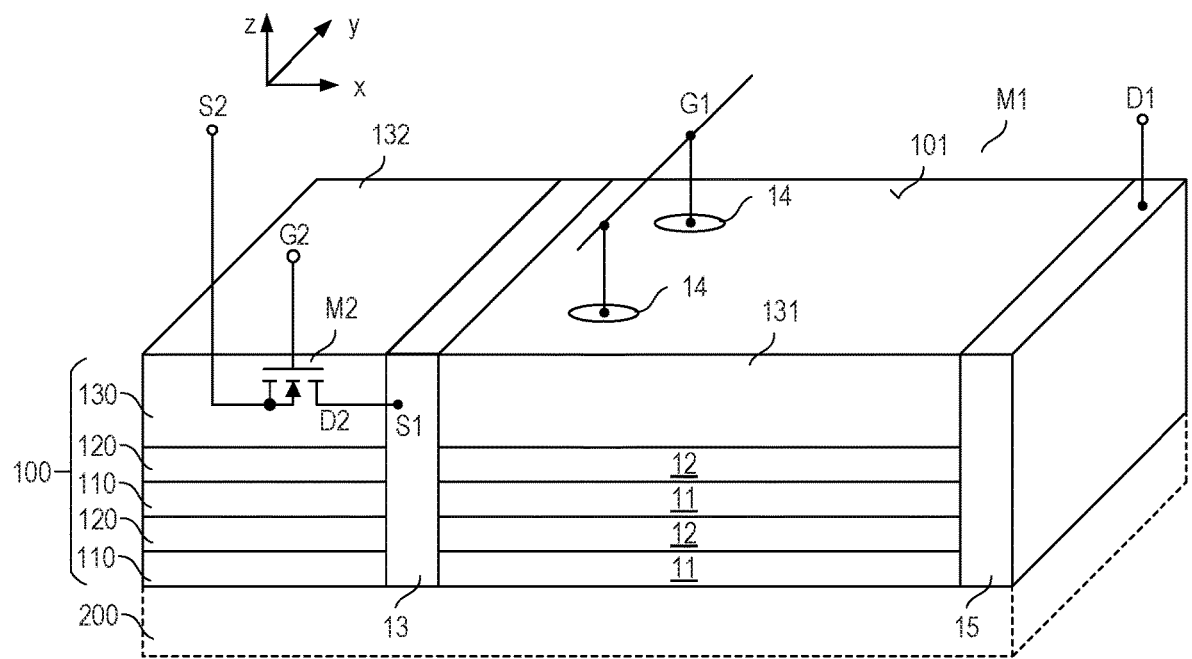
Figure 1B:
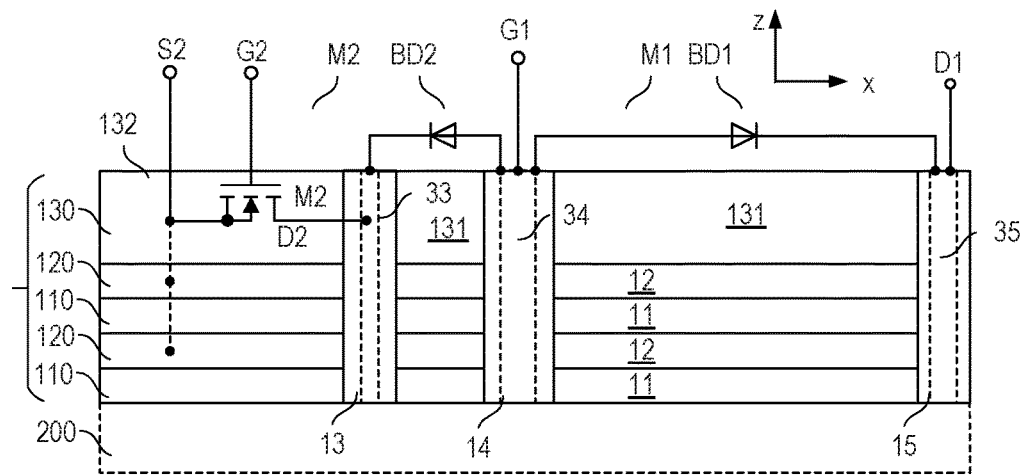

FIGS. 1A to 1C show a perspective sectional view (FIG. 1A), a vertical cross sectional view (FIG. 1B), and a horizontal cross sectional view (FIGS. 1C) of a transistor arrangement that includes a first transistor device M1 and a second transistor device M2. The transistor arrangement includes a layer stack with a plurality of first semiconductor layers 110 of a first doping type and a plurality of second semiconductor layers 120 of a second doping type that are arranged alternatingly. The second doping type is complementary to the first doping type. A source region 13 of a first transistor device M1 adjoins the plurality of first semiconductor layers 110, and a drain region 15 of the first transistor device M1 adjoins the plurality of first semiconductor layers 110 and is located spaced apart from the source region 13 in a first direction x. The source region 13 of the first transistor device M1 is also referred to as first source region 13 in the following, and the drain region 15 of the first transistor device M1 is also referred to as first drain region 15 in the following. The transistor arrangement further includes a plurality of gate regions 14 of the first transistor device M1. Each of the plurality of gate regions 14 adjoins at least one of the plurality of second semiconductor layers 120, is arranged between the first source region 13 and the first drain region 15, and is spaced apart from the first source region 13 and the first drain region 15.

As used herein, a layer or region of the first doping type is a layer or region with an effective doping of the first doping type. Such region or layer of the first doping type, besides dopants of the first doping type, may also include dopants of the second doping type, but the dopants of the first doping type prevail. Equivalently, a layer or region of the second doping type is a layer or region with an effective doping of the second doping type and may contain dopants of the first doping type.

Referring to FIGS. 1A to 1C, the transistor arrangement further includes a third semiconductor layer 130 that adjoins the layer stack with the first layers 110 and the second layers 120 and each of the first source region 13, the first drain region 15, and the gate regions 14. Active regions of the second transistor device M2 are integrated in the third semiconductor layer 130 in a second region 132. The second region 132 is spaced apart from a first region 131 of the third semiconductor layer 130, wherein the third region is bordered by the first source region 13 and the first drain region 15. At least the first region 131 is a region of the second doping type. The second transistor device M2 is only schematically illustrated in FIGS. 1A and 1B and represented by a circuit symbol.

The third semiconductor layer 130 and the layer stack with the first and second semiconductor layers 110, 120 form an overall layer stack 100, which is also referred to as semiconductor body 100 in the following. The semiconductor body 100 may include a conventional semiconductor material such as, for example, silicon (Si), silicon carbide (SiC), gallium nitride (GaN), gallium arsenide (GaAs), or the like. The semiconductor body 100 may be arranged on any kind of carrier 200 (illustrated in dashed lines in FIGS. 1A and 1B. Examples of this carrier 200 are explained herein further below.

According to one example, the overall number of first layers 110 in the layer stack equals the overall number of second layers 120. In the example shown in FIGS. 1A and 1B, an uppermost layer of the layer stack is a second layer 120 and a lowermost layer is a first layer 110. The "uppermost layer" is the layer adjoining the third layer 130, and the lowermost layer is the layer spaced apart from the uppermost layer most distantly. However, implementing the uppermost layer as a second layer 120 and the lowermost layer as a first layer 110 is only an example. According to another example, not shown, the uppermost layer is a first layer and the lowermost layer is a second layer. Just for the purpose of illustration, the layer stack with the first and second layers 110, 120 includes two first layers 110 and two second layers 120, that is, four layers overall. This, however, is only an example. According to one example, the overall number of layers 110, 120 in the layer stack is between 4 and 60, in particular between 6 and 30.

The first direction, which is the direction in which the first source region 13 and the first drain region 15 are spaced apart from each other, is a first lateral direction x of the semiconductor body in the example shown in FIGS. 1A to 1C. A "lateral direction" of the semiconductor body 100 is a direction parallel to a first surface 101 of the semiconductor body 100. The first and second layers 110, 120 and the third layer 130 are essentially parallel to the first surface 101 in the example shown in FIGS. 1A to 1C. In this example, each of the first source region 13 and the first drain region 14 extend in a vertical direction z in the semiconductor body 100 so that each of the first source region 13 and the first drain region 15 adjoins the third layer 130 and the first layers 110. The "vertical direction" z is a direction perpendicular to the first surface 101. Further, the gate regions 14 extend in the vertical direction z in the semiconductor body 100 so that each of the plurality of gate regions 14 adjoins each of the second semiconductor layers 12. The gate regions 14 are spaced apart from each other in a second lateral direction y. This second lateral direction y is different from the first lateral direction x and may be perpendicular to the first lateral direction x.

The first transistor device M1 is a lateral superjunction depletion device, more specifically, a lateral superjunction JFET (Junction Field-Effect Transistor). In this transistor device M1, each of the first source region 13 and the first drain region 15 is a region of the first doping type and each of the gate regions 14 is a region of the second doping type. Further, in the section of the semiconductor body 100 between the first source region 13 and the first drain region 15, the first semiconductor layers 110 form drift regions 11 and the second semiconductor layers 120 form compensation regions 12 of the superjunction device. The function of these drift and compensation regions is explained herein further below.

A type of this first transistor device M1 is defined by the first doping type. The first transistor device M1 is an n-type JFET when the first doping type is an n-type and the second doping type is a p-type. Equivalently, the first transistor device M1 is a p-type JFET when the first doping type is a p-type and the second doping type is an n-type.

According to one example, the first source region 13, the drain region 15, the plurality of gate regions 14, the first and second layers 110, 120 forming the drift and compensation regions 11, 12, and the third layer 130 are monocrystalline semiconductor regions. According to one example, these regions include monocrystalline silicon (Si) and a doping concentration of the first source region 13 is selected from a range of between 1E17 cm$^{-3}$ (=1·10$^{17}$ cm$^{-3}$) and 1E21 cm$^{-3}$, a doping concentration of the drift regions 11 is selected from a range of between 1E13 cm$^{-3}$ and 5E17 cm$^{-3}$, and a doping concentration of the gate regions 14 is selected from a range of between 1E17 cm$^{-3}$ and 1E21 cm$^{-3}$. The doping concentration of the first drain region 15 can be selected from the same range as the doping concentration of the first source region 13, and the doping concentration of the compensation regions 12 can be selected from the same range as the doping concentration of the drift regions 11.

Referring to FIGS. 1A and 1B, the gate regions 14 of the first transistor device M1 are connected to a first gate node G1 and the first drain region 15 is connected to a first drain node D1. The first gate node G1 and the first drain node D1 are only schematically illustrated in FIGS. 1A and 1B. These nodes G1, D1 may include metallizations (not shown) on top of the semiconductor body 100. Optionally, as illustrated in dashed lines in FIG. 1B, a first connection electrode 34 may be embedded in each of the gate regions 14 and a second connection electrode 35 may be embedded in the drain region 15. The first connection electrodes 34 are connected to the gate node G1 and serve to provide a low-ohmic connection between each section of the gate regions 14 and the first gate node G1. The second electrode 35 is connected to the drain node D1 and provides a low-ohmic connection between each section of the drain region 15 and the drain node D1. Further, a third electrode 33 may be embedded in the first source region 13. Referring to FIG. 1B, each of the first, second and third connection electrodes 34, 35, 33 may extend along a complete length of the respective semiconductor region 14, 15, 13 in the vertical direction z. Each of these electrodes 34, 35, 33 includes an electrically conducting material. Examples of such electrically conducting material include, but are not restricted to: a metal such as copper (Cu), aluminum (Al), tantalum (Ta), titanium (Ti), cobalt (Co), nickel (Ni) or tungsten (W); a highly doped polycrystalline semiconductor material such as polysilicon; or a metal silicide, such as tungsten silicide (WSi), titanium silicide (TiSi), Cobalt silicide (CoSi), or nickel silicide (NiSi).

The main function of the third semiconductor layer 130 is to accommodate the second transistor device M2. Therefore, the semiconductor layer 130 is designed such that it provides sufficient space to integrate active regions of the second semiconductor M2 in the second region 132. According to one example, a thickness of the third semiconductor layer 130 in the second region 132 is between 1 micrometers (μm) and 7 micrometers, in particular between 3 and 5 micrometers. The "thickness" is the dimension of the third layer 130 in the vertical direction. According to an example, a thickness of the third semiconductor layer is at least twice a thickness of a single first semiconductor layer 110 or a single second semiconductor layer 120. According to one example, a thickness of the third semiconductor layer 130 is at least twice a thickness of each of the first semiconductor layers 110 and the second semiconductor layers 120. The thickness of a single first semiconductor layer 110 or a single second semiconductor layer 120 is, for example, between 100 nanometers (nm) and 3 micrometers (μm). According to another example, a thickness of the third semiconductor layer 130 is greater than a distance between the first source region 13 and each of the gate regions 14.

In or on top of the first region 131 the transistor arrangement may include an edge termination structure (not shown in FIGS. 1A to 1C). This edge termination structure may reduce the thickness of the third layer 130 in the first region 131 as compared to the second region 132. Examples of edge termination structures are explained herein further below.

At least the first region 131 of the third semiconductor layer 130 is a region of the second doping type so that a first p-n junction is formed between the first drain region 15 and the first region 131 and a second p-n junction is formed between the first source region 13 and the first region 131. These p-n junctions are part of two bipolar diodes, a first bipolar diode BD1 formed by the gate regions 14, the first region 131 and the first drain region 15, and a second bipolar diode BD2 formed by the gate regions 14, the first region 131 and the first source region 13. In each of these bipolar diodes, the first region 131 of the third semiconductor layer 130 forms a base region. Circuit symbols of these bipolar diodes are shown in FIG. 1B. According to one example, a doping concentration of the first region 131 of the third semiconductor layer 130 is such that a voltage blocking capability of the first bipolar diode BD1 is equal to or higher than a voltage blocking capability of the first transistor device M1.

The "voltage blocking capability" of the first transistor device M1 is defined by a maximum level of a voltage between the first drain node D1 and the gate node G1 the first transistor device M1 can withstand in an off-state. Dependent on the specific design, the voltage blocking capability may range from 20V up to several 100 volts. This voltage blocking capability may be adjusted, inter alia, by suitably selecting a distance between the first gate region 14 and the first drain region 15. In a first transistor device with a voltage blocking capability of 650 volts, for example, the distance may be selected from between 40 micrometers and 60 micrometers and a doping concentration of the first region 131 may be selected from a range of between 1E13 cm$^{-3}$ and 1E15 cm$^{-3}$, in particular from between 1.1E14 cm$^{-3}$ and 4.6E14 cm$^{-3}$.

The layer stack with the first and second semiconductor layers 110, 120 adjoins the third layer 130 and, therefore, the second region 132 in which active regions of the second transistor device M2 are integrated. However, the third layer 130 and, in particular, the second region 132 is not obtained based on the first and second layers 110, 120. That is, the second region 132 is not obtained by additionally doping sections of the first and second layers 110, 120 with dopants of the second doping type in order to obtain an effective doping of the second doping type.

Referring to FIGS. 1A and 1B, the first source region 13 is electrically connected to a drain node D2 of the second transistor device M2. The second transistor device M2 further includes a gate node G2 and a source node S2. According to one example, the second transistor device M2 is a normally-off transistor device such as, for example, an enhancement MOSFET. Just for the purpose of illustration, the circuit symbol of the second transistor device M2 shown in FIGS. 1A and 1B represents an n-type enhancement MOSFET. This, however, is only an example. The second transistor device may be implemented as a p-type enhancement MOSFET or a p-type or n-type depletion MOSFET as well.

Optionally, as illustrated in dashed lines in FIG. 1B, those sections of the second semiconductor layers 120 that are arranged below the second region 132 and are separated from those sections that form the compensation regions 12 are connected to the second source node S2, Connections between these second layers 120 and the second source node S2 are schematically illustrated in FIG. 1B. Examples how these connections can be implemented are explained herein further below.

The first and second transistor device M1, M2 can be interconnected in various ways. According to one example, the source node S2 of the second transistor device M2 is connected to the gate node G1 of the first transistor device M1. An electronic circuit diagram of a transistor arrangement in which the gate node G1 of the first transistor device M1 is connected to the source node S2 of the second transistor device M2 is shown in FIG. 2A. Just for the purpose of illustration and the following explanation it is assumed that the first transistor device is an n-type JFET and the second transistor device is an n-type enhancement MOSFET. The second gate node G2, the second source node S2 and the first drain node D1 are circuit nodes that may serve to connect the transistor arrangement to other devices, a power source, ground or the like in an electronic circuit.

The transistor arrangement may include a housing (package) 300 that is schematically illustrated in FIG. 2A. In this case, the second gate node G2, the second source node S2 and the first drain node D1 are external circuit nodes that are accessible outside the housing 300. According to one example, the gate node G1 of the first transistor device M1 is connected to the source node S2 of the second transistor device M2 inside the housing. A connection between the second source node S2 and the first gate node G1 may be formed by a wiring arrangement (not shown in the figures) that is located on top of the first surface 101 of the semiconductor body 100. According to another example, the first gate node G1 is accessible outside the housing and the first gate node G1 is connected to the second source node S2 by a connection outside the housing 300.

Although the transistor arrangement includes two transistors, first transistor device (JFET) M1 and second transistor device (MOSFET), it can be operated like one single transistor. An operation state of the transistor arrangement is defined by an operation state of the MOSFET M2. The transistor arrangement acts like a voltage controlled transistor that switches on or off dependent on a drive voltage $V_{GS2}$ received between the second gate node G2 and the second source node S2. This drive voltage is also referred to as gate-source voltage $V_{GS2}$ in the following.

The function of the transistor arrangement shown in FIGS. 1A-1C and 2A is explained below. Just for the purpose of explanation, it is assumed that the first transistor device M1 an n-type JFET and the second transistor device M2 is an n-type enhancement MOSFET. Furthermore, for the purpose of explanation, it is assumed that the transistor arrangement operates as an electronic switch connected in series with a load Z, wherein a series circuit with the load Z and the transistor device receives a supply voltage V1.

Referring to FIG. 2, the MOSFET M2 is controlled by the gate-source voltage $V_{GS2}$ received between the second gate node G2 and the second source node S2. The MOSFET M2 is in an on-state (conducting state) when a voltage level of the gate-source voltage $V_{GS2}$ is higher than a predefined threshold voltage level $V_{th1}$. In an n-type enhancement MOSFET, the threshold voltage level $V_{th1}$ is a positive voltage level. The JFET M1 is controlled by a gate-source voltage $V_{GS1}$ received between the first gate node G1 and the first source node S1. An n-type JFET, such as the JFET M1 shown in FIG. 2, is in the on-state when a voltage level of the gate-source voltage, such as the gate-source voltage $V_{GS1}$ shown in FIG. 2, is higher than a predefined threshold level $V_{th2}$. That is, the JFET M1 is in the on-state, when $V_{GS1} > V_{th1}$, where $V_{th1} < 0$. As the gate node G1 of the JFET M1 is connected to the source node S2 of the MOSFET M2, the gate-source voltage $V_{GS1}$ of the JFET M1 equals the inverted drain-source voltage $V_{DS2}$ of the MOSFET M2, that is, $V_{GS1} = -V_{DS2}$. The drain-source voltage $V_{DS2}$ of the MOSFET M2 is the voltage between the drain node D2 and the source node S2 of the MOSFET M2.

When the MOSFET M2 is in the on-state, a magnitude of the drain-source voltage $V_{DS2}$ is very low, so that the gate-source voltage $V_{GS1}$ of the JFET is between the negative threshold level $V_{th1}$ and zero. Thus, the JFET M1 is also in the on-state. When the MOSFET M2 switches off, the drain-source voltage $V_{DS2}$ increases until the inverted drain-source voltage $-V_{DS2}$ reaches the negative threshold voltage $V_{th1}$, so that the JFET M1 also switches off.

Referring to FIGS. 1A-1C, in the on-state of the JFET M1 and the MOSFET M2, a current can flow from the first drain node D1 via the drain region 15, the drift regions 11, the first source region 13, and the drain-source path D2-S2 of the MOSFET M2 to the second source node S2. When the MOSFET M2 switches off, the electrical potential at the first drain node D1 can increase relative to the electrical potential at the second source node S2. This increase of the electrical potential at the first drain node D1 causes an increase of the electrical potential at the first source region 13, while the electrical potential at the gate regions 14 is tied to the electrical potential at the second source node S2. The increase of the electrical potential of the first source region 13 and the drift regions 11 causes p-n junctions between the first source region 13 and the compensation regions 12 and between the gate regions 14 and the drift regions 11 to be reverse biased. Furthermore, p-n junctions between the drift regions 11 and the compensation regions 21 are reverse biased. Reverse biasing those p-n junctions causes the drift regions 11 to be depleted of charge carriers. The JFET M1 switches off as soon as the drift regions 11 between the at least two gate regions 14 and/or between the gate regions 14 and the first source region 13 has been completely depleted of charge carriers.

FIG. 1C shows a horizontal cross sectional view of the transistor device in a horizontal section plane C-C going through one of drift regions 11. In FIG. 1C, reference character $11_1$ denotes a section of the drift region 11 between two gate regions 14, and $11_2$ denotes a section of the at least one drift region 11 between the gate regions 14 and the first source region 13. The threshold voltage $V_{th1}$ of the JFET M1 is the voltage that needs to be applied between the gate regions 14 and the first source region 13 in order to completely deplete at least one of these sections $11_1$, $11_2$. In FIG. 1C, d1 denotes a distance between two gate regions 14 in the second direction y. The magnitude (the level) of the threshold voltage $V_{th1}$ is dependent on several design parameters and can be adjusted by suitably designing these parameters. These design parameters include the (shortest) distance d1 between two gate regions 14, a doping concentration of the drift region 11 in the section $11_1$ between the gate regions 14, and a doping concentration of the compensations region 21 (out of view in FIG. 1C) in a section that is located between the gate regions 14 and adjoins section $11_1$ of the drift regions 11.

According to one example, the drift regions 11 in the section $11_1$ between the gate electrodes 14 includes a higher doping concentration than in sections spaced apart from the gate regions 14 in the direction of the drain region 13. This higher doped section $11_1$ counteracts an increase in the on-resistance caused by the gate regions 14, which reduce the cross section in which a current can flow between the source an drain regions 13 and 15. According to one example, the compensation regions at least in parts of sections arranged between the gate regions 14 include a higher doping concentration than in other sections, in particular, those sections spaced apart from the gate electrodes 14 in the direction of the drain region 15. This higher doped section ensures that the drift regions 11 in the section between the gate regions 14 is depleted of charge carriers, so that the JFET M1 blocks, when the threshold voltage $V_{th1}$ is applied. According to one example, the higher doped region of the at compensation regions 12 is not only arranged between the gate regions 14, but surrounds the gate regions 14 in a horizontal plane, which is a plane parallel to the first surface 101.

The MOSFET M2 is designed such that a voltage blocking capability of this MOSFET M2 equals or is higher than a magnitude of threshold voltage $V_{th1}$ of the JFET M1, that is $V_{DS2\_MAX} \geq |V_{th1}|$, where $V_{DS2\_MAX}$ is the voltage blocking capability of the MOSFET M2. The voltage blocking capability of the MOSFET M2 is the maximum voltage, the MOSFET M2 can withstand between the drain node D2 and the gate node G1.

In the example shown in FIG. 2A, the transistor arrangement includes three external circuit nodes, the first drain node D1, the second source node S2, and the second gate node G2. According to another example shown in FIG. 2B, additionally to these circuit nodes D1, S2, G2, the first source node S1 is also accessible. According to yet another example shown in FIG. 2C, the second transistor M2 may be deactivated by connecting the second gate node G2 with the second source node S2. In this case, only the first transistor device M1 is active and can be driven by applying a drive voltage $V_{GS1}$ between the first gate node G1 and the first source node S1. According to one example, the first drain node D1, the first gate node G1, the first source node S1, the second gate node G2, and the second source node S2 are external circuit nodes that are accessible outside the housing. In this case, a user/costumer may choose one of the configurations shown in FIGS. 2A to 2C by suitably connecting these circuit nodes D1, G1, S1, G2, and S2. FIG. 2D illustrates another example. In this example, the source nodes S1, S2, the drain nodes D1, D2, and the gate nodes G1, G2 of each of the first and second transistor device M1, M2 are accessible outside of the housing 300.

According to one example, the first and second layers 110, 120 are implemented such that the drift regions 11 and the compensation regions 12 are essentially balanced with regard to their dopant doses. That is, at each position in the current flow direction of the first transistor device, the amount of dopant atoms (dopant charges) in one drift region 11 essentially corresponds to the amount of dopant atoms in the neighboring compensation region 12. "Essentially" means that there may be an imbalance of up to +/–10%. That is, there may be 10% more or less dopant atoms in the drift regions 11 than in the compensation regions 12. Thus, when the first transistor device is in the off-state and depletion regions (space charge regions) expand in the drift and compensation regions 11, 12 essentially each doping atom in each drift region 11 has a corresponding doping atom (which may be referred to as counter doping atom) of a complementary doping in the compensation regions 12 and the drift and compensation regions 11, 12 can completely be depleted. As commonly known, compensation regions in a superjunction transistor device, such as JFET M1 shown in FIGS. 1A-1C and 2A-2D, make it possible to implement the drift regions with a higher doping concentration than in a conventional, non-superjunction device. This reduces the on-resistance, which is the electrical resistance in the on-state, without decreasing the voltage blocking capability.

Referring to the above, the second transistor device M2 may be implemented in various ways. Some examples for implementing the second transistor M2 are explained with reference to FIGS. 3A-3B, 4, 5 and 6A-6B below. FIGS. 3A and 3B show a first example of the second transistor device M2, wherein FIG. 3A shows a vertical cross sectional view and FIG. 3B shows a horizontal cross sectional view of the second transistor device M2. Referring to FIG. 3A, the second transistor device M2 includes a source region 21 and a drain region 23 spaced apart from the source region 21 in the first lateral direction x. The drain region 23 adjoins the source region 13 of the first transistor device M1 in order to electrically connect the source region 13 of the first transistor device with the drain region 23 of the second transistor device M2. The drain region 23 of the second transistor device M2 is also referred to as second drain region in the following. The source region 21 of the second transistor device M2, which is also referred to as second source region 21 in the following, and the second drain region 23 are separated by a body region 22. The body region 22 has a doping type that is complementary to the doping type of the second source region 21 and the second drain region 23. A doping concentration of the body region 22 is, for example, selected from a range of between 1E16 cm$^{-3}$ and 1E19 cm$^{-3}$, in particular from between 1E17 cm$^{-3}$ and 1E18 cm$^{-3}$.

The second transistor device M2 may be implemented as an enhancement device (normally-off device) or a depletion (normally on-device). In a normally-off device, the body region 22 adjoins the gate dielectric 25 (and the gate electrode 24, in the on-state of the second transistor device M2, generates an inversion channel in the body region 22 along the gate dielectric 25), In a normally-on device, a channel region (not shown) of the first doping is arranged between the body region 22 and the gate dielectric 25 and extends from the second source region 21 to the second drain region 23 (and the gate electrode 24, in the off-state of the second transistor device M2, depletes the channel region of charge carriers).

In the example shown in FIGS. 3A and 3B the second drain region 23 adjoins the first source region 13. This, however, is only an example. According to another example (not shown), the second drain region 23 and the first source region 13 are connected via a wiring arrangement located on top of the first surface 101 of the semiconductor body 100.

Referring to FIG. 3A, a gate electrode 24 is adjacent the body region 22 and dielectrically insulated from the body region 22 by a gate dielectric 25. This gate electrode 24 is electrically connected to the second gate node G2. The second source region 21 is electrically connected to the second source node S2. According to one example, the second transistor device M2 is an n-type transistor device. In this case, the second source region 21 and the second drain region 23 is n-doped, while the body region 22 is p-doped. According to another example, the second transistor device M2 is a p-type transistor device. In this case, the second source region 21 and the second drain region 23 are p-doped semiconductor regions, while the body region 22 is an n-doped semiconductor region. The second transistor device M2 shown in FIG. 3A is an enhancement transistor device. In this transistor device, the body region 22 adjoins the gate dielectric 25. According to another example (not shown), the second transistor device M2 is a depletion transistor device. In this case, there is a channel region of the same doping type as the second source region 21 and the second drain region 23 arranged between the body region 22 and the gate dielectric 25 and extends from the second source region 21 to the second drain region 23. Referring to FIG. 3B, which shows a horizontal cross sectional of the second transistor device M2, the second source region 21, the second drain region 23, and the body region 22 may be elongated in the second lateral direction y of the semiconductor body 100.

Referring to FIG. 3B, a connection region 26 of the second doping type may be connected to the second source node S2 and extend through the second region 132 and the layer stack with the first and second layers 110, 120. This connection region 26 connects those sections of the second layers 120 that are arranged below the second region 132 to the second source region S2. Those sections of the first layers 110 that are arranged below the second region 132 are connected to the first source region 13 and, as the first source region 13 is connected to the second drain region 23, to the second drain region 23. Because of the fact that, below the second region 132, the second layers 120 are connected to the second source node S2 and that the first layers 110 are connected to the second drain node D2 a depletion region can expand in the first and second layer sections 110, 120 below the second region 132 when the second transistor device M2 is in the off-state.

FIG. 4 shows a modification of the transistor device shown in FIGS. 3A and 3B. In this modification, the transistor device M2 includes a drift region 27 (which may also be referred to as drain extension) between the body region 22 and the drain region 23. The drift region 27 has a lower doping concentration than the drain region 23 and the same doping type as the drain region 23. A field electrode 29 is adjacent the drift region 27 and dielectrically insulated from the drift region 27 by a field electrode dielectric 28. According to one example, the field electrode dielectric 28 is thicker than the gate dielectric 25. As illustrated, the field electrode 29 may be electrically connected with the gate electrode 24, for example, by forming the gate electrode 24 and the field electrode as one conductive layer. This is illustrated in FIG. 4. According to another example (not shown), the field electrode 29 is electrically connected to the second source node S2 and electrically insulated from the gate electrode 24.

FIG. 5 shows another modification of the transistor device shown in FIGS. 3A and 3B. In the example shown in FIG. 5, the gate electrode 24 and the gate dielectric 25 overlap the drift region 27, but, in the first lateral direction x, do not extend to the drain region 23. An insulation region 41 is arranged between the drift region 27 and those regions of the first surface 101 that are not covered by the gate electrode 24 and the gate dielectric 25. This insulation region 41 may adjoin the drain region 23, as shown in FIG. 5. In this example, the drift region 27 adjoins the drain region 23 in a region spaced apart from the first surface 101. The insulation region 41 may include a conventional electrically insulating material such as an oxide. The insulation region 41 may be implemented as a so called STI (Shallow Trench Isolation) and include a thermally grown oxide.

In the example shown in FIGS. 3A, 4, and 5, the gate electrode 24 is arranged on top of the first surface 101 of the semiconductor body. This, however, is only an example. According to another example shown in FIGS. 6A and 6B, there are several gate electrodes 24 that are arranged in trenches extending from the first surface 101 into the semiconductor body 100. Each of these gate electrodes, in the first lateral direction x, extends from the second source region 21 to the second drain region 23 through the body region 22 and is dielectrically insulated from these semiconductor regions 21, 22, 23 by a gate dielectric 25. Each of these gate electrodes 24 is electrically connected to the second gate node G2, which is schematically illustrated in FIG. 6A.

Second transistor devices of the type shown in FIGS. 3A to 3B, 4, 5 and 6A to 6B can be implemented using conventional implantation and oxidation processes known from integrated CMOS (Complementary Metal Oxide Semiconductor) processes. The second transistor device may therefore also be referred to as CMOS device. The second region 132 may have a basic doping of the second doping type or may be intrinsic before forming the active regions (source, body and drain regions 21, 22, 23) of the second transistor device M2 in the second region 132. The basic doping concentration can be selected such that it essentially equals the doping concentration of the body region 22 or is lower than the doping concentration of the body region 22.

Figure 7A:
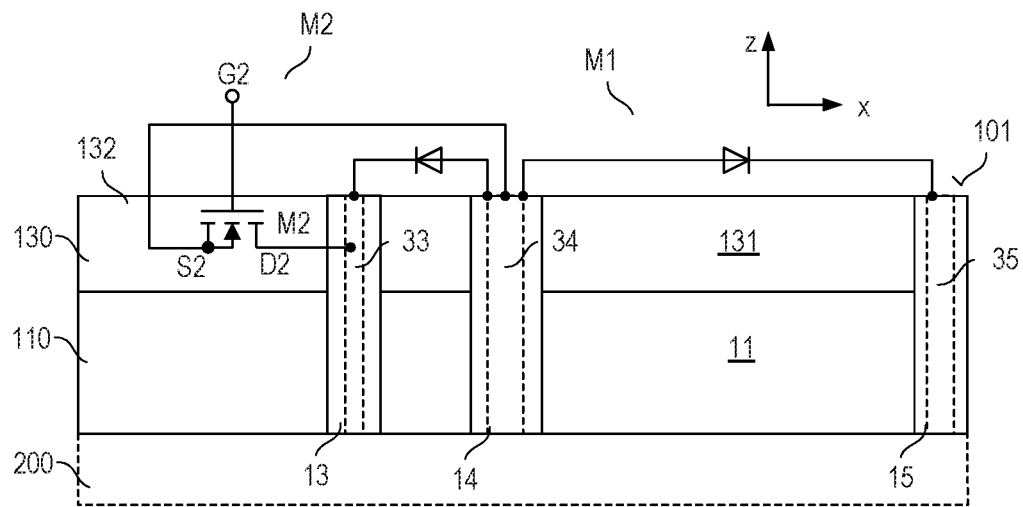
FIGS. 7A-7C show vertical cross sectional views (FIGS. 7A and 7B) and a horizontal cross sectional view (FIG. 7C) of a transistor arrangement with a first transistor device and a second transistor device according to another example.
Figure 7B:
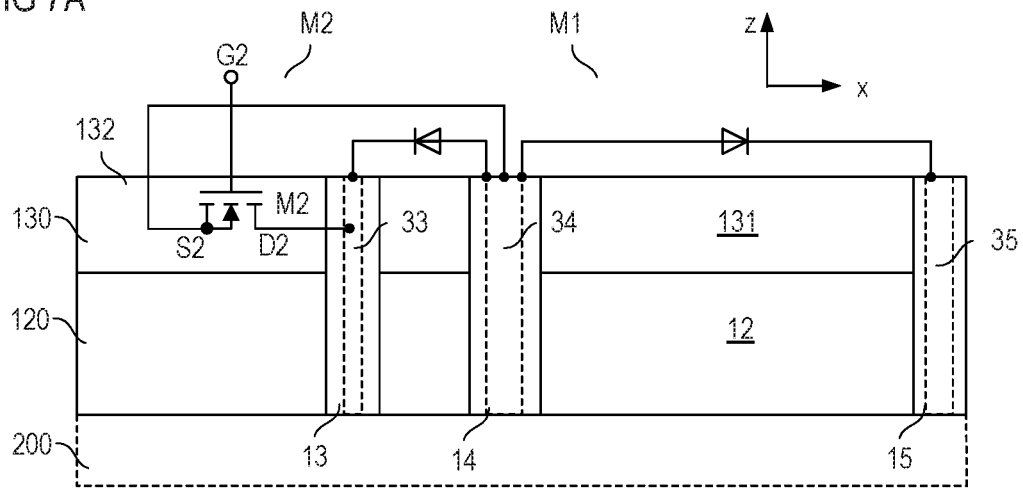
Figure 7C:
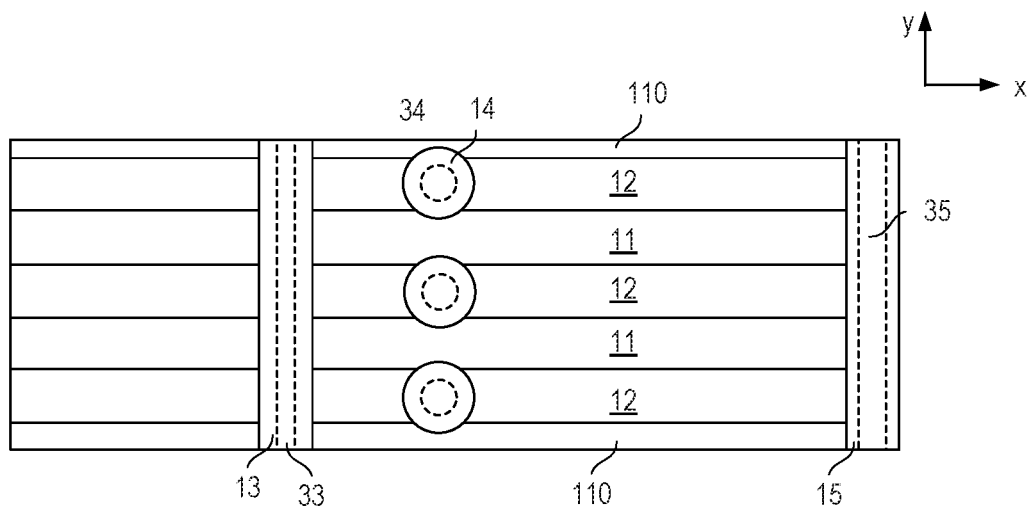

In the example shown in FIGS. 1A to 1C, the first and second layers 110, 120 in the layer stack are arranged such that they are essentially parallel to the third layer 130 and, therefore, parallel to the first surface 101 of the semiconductor body 100. According to another example shown in FIGS. 7A to 7C, the first and second layers 110, 120 are arranged such that they are essentially perpendicular to the third layer 130, and, therefore, perpendicular to the first surface 101 of the semiconductor body 100. FIG. 7A shows a vertical cross sectional view of the transistor arrangement in a vertical section plane that goes through one of the plurality of first semiconductor layers 110, FIG. 7B shows a vertical cross sectional view in a section plane that goes through one of the second semiconductor layers 120, and FIG. 7C shows a horizontal cross sectional view in a section plane that goes through the layer stack with the first and second semiconductor layers 110, 120. As in the example shown in FIGS. 1A to 1C, the second transistor device M2 is only schematically illustrated and represented by a circuit symbol in the example shown in FIGS. 7A to 7C. This second transistor device M2 may be implemented in accordance with any one of the examples explained with reference to FIGS. 3A to 3B, 4, 5, and 6A to 6B. Referring to FIG. 7C, in this transistor arrangement, each of the gate regions 14 may be arranged in one of the second layers 120, wherein the gate regions 14 may extend beyond the second layers 120 in the second lateral direction y. Nevertheless, two neighboring gate regions 14 are spaced apart from each other in the second lateral direction y and separated by a region of a drift region 11. The function of the first transistor device M1 shown in FIGS. 7A to 7C is the same as the function of the first transistor device M1 shown in FIGS. 1A to 1C.

Figure 8:
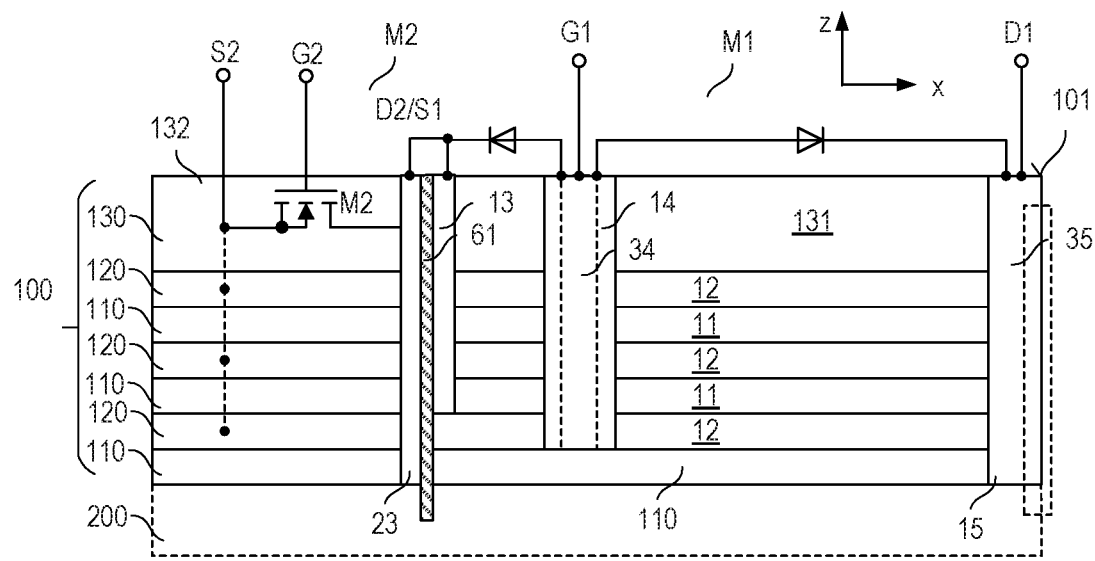
FIG. 8 shows a vertical cross sectional view of a transistor according to another example.

FIG. 8 shows another modification of the transistor device shown in FIGS. 1A to 1C. In this example, an insulation layer 61 extends from the first surface 101 through the third layer 130 and the layer stack with the first and second layers 110, 120. The insulation layer 61 may extend into the carrier 200.

Further, the insulation layer separates the first source region 131 from the second drain region 23 inside the semiconductor body 100, wherein the first source region 13 and the second drain region 23 are electrically connected by a wiring arrangement arranged on top of the first surface 101 in order to connect the drain-source path D2-S2 of the second transistor device M2 in series with the drain-source path D1-S1 of the first transistors device M1. An electrical connection between the first source region 13 and second drain region 23 is only schematically illustrated in FIG. 8. The insulation layer 61 completely insulates the first transistor device M1 from the second transistor device M2 inside the semiconductor body 100. In order to connect the first layers 110 below the second region 132 to the second drain node D2 the second drain region 23, in the vertical direction z, extends into the layer stack with the first and second layers 110, 120. Other active regions of the second transistor device M2 are not shown in FIG. 8.

In the first transistor M1, the lowermost first layer 110 is not connected to the first source region 13 and the first source region 13 is arranged such that there are two p-n junctions between the first source region 13 and the lowermost first layer 110, a first p-n junction between the first source region and a lowermost second layer 120 in the layer stack, and a second p-n junction between the lowermost second layer 120 and the lowermost first layer 110. Because of the fact that the lowermost first layer 110 is not connected to the first source region 13 the lowermost first layer 110 does not form one of the drift regions 11 of the first transistor M1 in this example but a junction isolation between the gate regions 14 and the carrier.

A topology as shown in FIG. 8 can be used, for example, when the transistor arrangement is used as a high-side switch. FIGS. 2A and 2B show circuit topologies in which the transistor arrangement is used as a low-side switch. In these topologies, the transistor arrangement is connected between the load Z and a circuit for a negative supply potential or ground potential GND. When used as a high-side switch, the transistor arrangement, different from what is shown in FIGS. 2A and 2B, is connected between the load Z and the circuit node for the positive supply potential V1. When the transistor arrangement is used as a high-side switch the carrier 200 may be connected to the negative supply potential or ground potential GND. Operating scenarios that may occur when the transistor arrangement is used as a high-side switch and the function of the insulation layer 62 and the lowermost first layer 110 in these operating scenarios are explained in the following.

In the on-state of the transistor arrangement, the potential at the first drain node D1 equals the positive supply potential V1, the potential at the first source node S1 equals the positive supply potential V1 minus a voltage drop between the second drain node D2 and the first source node S1. This voltage drop is dependent on a load current through the transistor arrangement. In a transistor arrangement with a voltage blocking capability of several 100 volts this voltage drop in the on-state is not higher than several volts so that the potential of the first source node S1 and the first source region 13 is about the same as the positive supply potential V1. The same applies to the potential at the first gate node G1 and the gate regions 14. In this operating mode, a p-n junction between the gate regions 14 and the lowermost first layer 110 isolates the gate regions 14 from the carrier 200 which has the negative supply potential GND. Referring to examples explained herein further below, the carrier may include a semiconductor material of the second type, that is, complementary to the first type of the lowermost layer 110. In this case, a p-n junction between the lowermost first layer 100 and the carrier 200 junction isolates the lowermost first layer 110 from the carrier.

In the off-state of the transistor arrangement, the potential at the first drain node D1 equals the positive supply potential V1, the potential at the first source node S1 is much lower than the first supply potential V1. In this operating scenario, the lowermost first layer 110, in a section below the first region 131, essentially has the first drain D1 potential and, in a section below the second region 132, essentially has the first source S1 potential. The insulation layer 61 electrically isolates these sections from each other in this operating mode. Further, one of the two p-n junctions explained above between the first source region 13 and the lowermost first layer 110 junction isolates the first source region 13 from the lowermost first layer 110.

Figure 9:
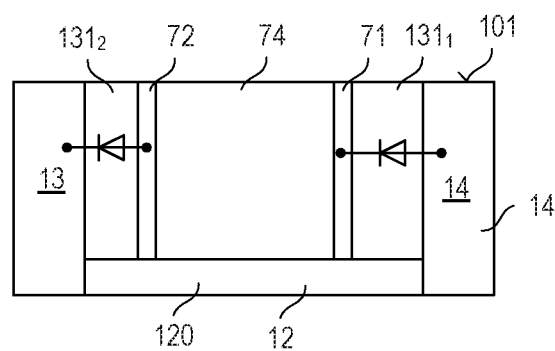
FIG. 9 is a detailed view of one example of a logic island between a gate region and a source region of the first transistor device.

According to an example shown in FIG. 9, a logic island 74 is integrated in the first region 131 in a section between the first source region 13 and the gate regions 14. One example of this logic island 74 is shown in FIG. 9. In this example, the logic island 74 extends from the first surface 101 to the uppermost layer 120 of the layer stack. Towards the gate regions 14, the logic island 74 is bordered by a region 71 of the first doping type. Between this regions 71 of the first doping type and the gate regions 14, a section $131_1$ having the basic doping of the first region 131 is arranged. The gate regions 14, the section $131_1$ of the first region 131 and the region 71 of the first doping type form a bipolar diode. The circuit symbol of this diode is schematically illustrated in FIG. 9. Towards the first source region 13, the logic island 74 is bordered by a region 72 of the second doping type. This region 72 of the second doping type has a higher doping concentration than the basic doping of the first region 131 and is separated from the first source region 13 by another section $131_2$ having the basic doping of the first region 131. The region 72 of the second doping type, the section $131_2$ of the first region 131 and the first source region 13 form another diode. The circuit symbol of this diode is also shown in FIG. 9. Any type of electronic devices such as transistors, diodes, resistors, capacitors, or the like may be implemented in and/or on top of the logic island 74.

Alternatively or additionally to integrating electronic devices in the logic island 74 in the first region 131 of the third layer 130, additionally to the second transistor device 132, electronic devices may be integrated in the second region 132.

Figure 10:
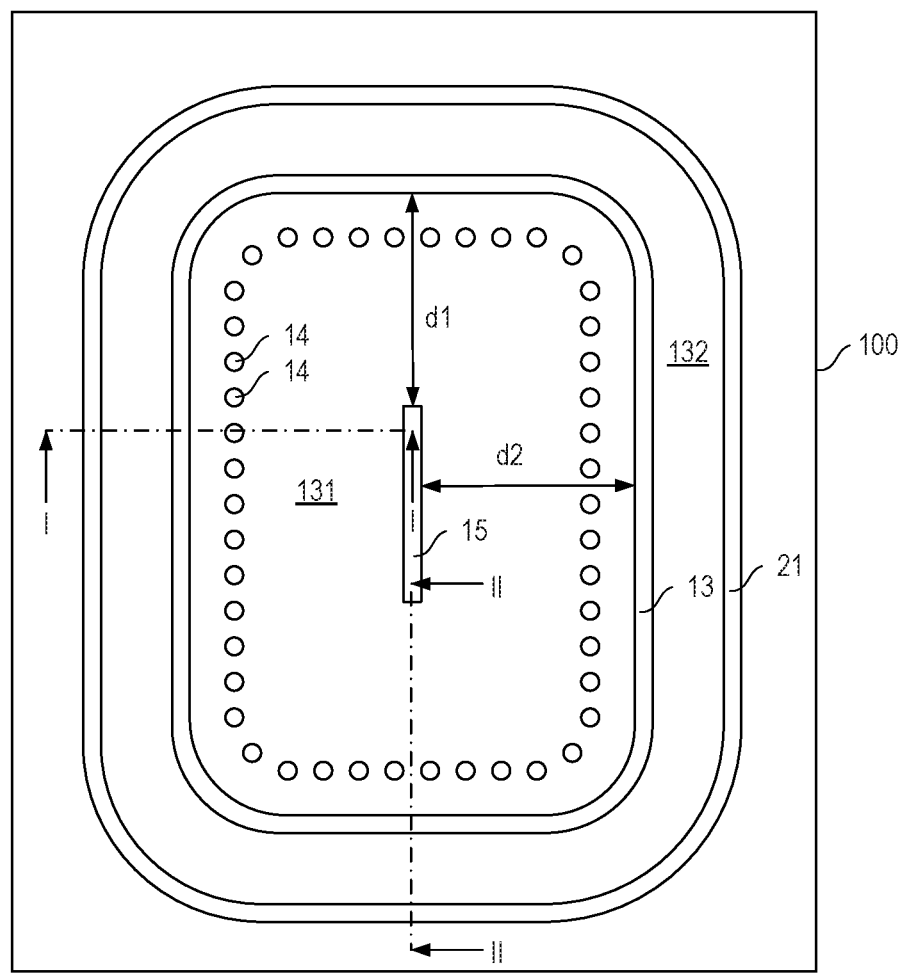
FIG. 10 shows a top view of a transistor arrangement according to one example.

According to one example, the transistor arrangement is designed such that the first source region 13, in a horizontal plane of the semiconductor body 100, surrounds the first drain region 15. One example of a transistor arrangement of this type is shown in FIG. 10, which shows a top view of the semiconductor body 100 of this type of transistor arrangement. In this transistor arrangement, the second transistor device, from which only the source region 21 is illustrated in FIG. 10, surrounds the first transistor device M1 in the horizontal plane of the semiconductor body 100. The layer stack with the first and second layers 110, 120 is out of view in FIG. 10. This layer stack is below the third layer 130 with the first region 131 and the second region 132 shown in FIG. 10.

In the example shown in FIG. 10, the drain region 15 is an elongated region, so that the first source region 13 and the second source region 21 each have essentially the form of a rectangular ring. The gate regions 14 are spaced apart from each other and are arranged such that they are essentially located on a line that has the form of a rectangle (with rounded corners).

In the transistor arrangement shown in FIG. 10, the first and second transistor device M1, M2 may be implemented in accordance with any of the examples explained herein before. Thus, in each of section planes I-I or II-II shown in FIG. 10 the transistor device may be implemented as explained before.

In the example shown in FIG. 10, a distance between the first drain region 15 and the first source region 13, at each position, is greater than a minimum distance required to obtain a desired voltage blocking capability of the first transistor device M1. According to one example, a shortest distance d1 between a longitudinal end of the first drain region 15 and the first source region 13 is larger than a shortest distance d2 between the first drain region 15 and the first source region 13 along longitudinal sides of the first drain region 15. This is to make sure that when a breakdown occurs the breakdown occurs in regions between the longitudinal sides of the first drain region 15 and the first source region 13.

Figure 11:
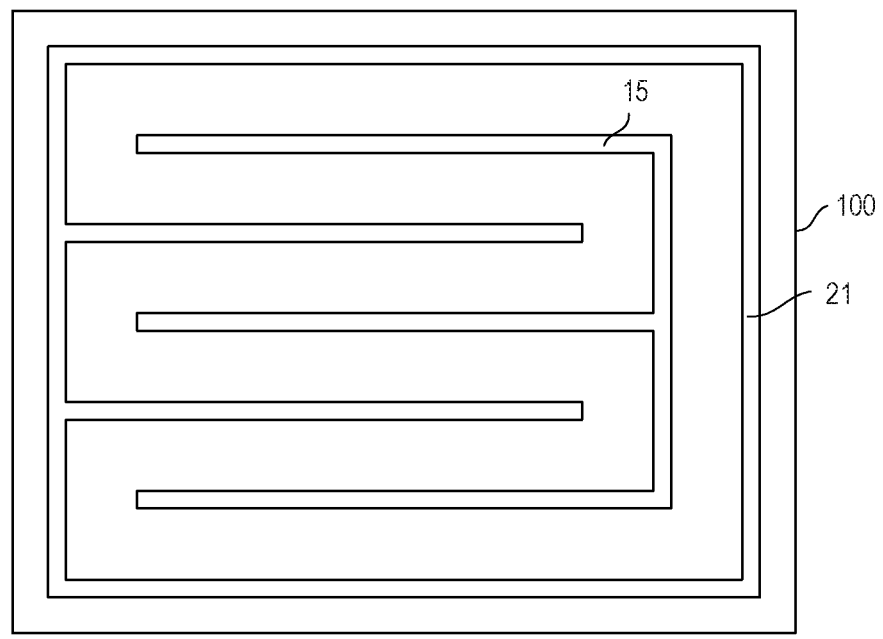
FIGS. 11 and 12 shows top views of the transistor arrangement according to further examples.
Figure 12:
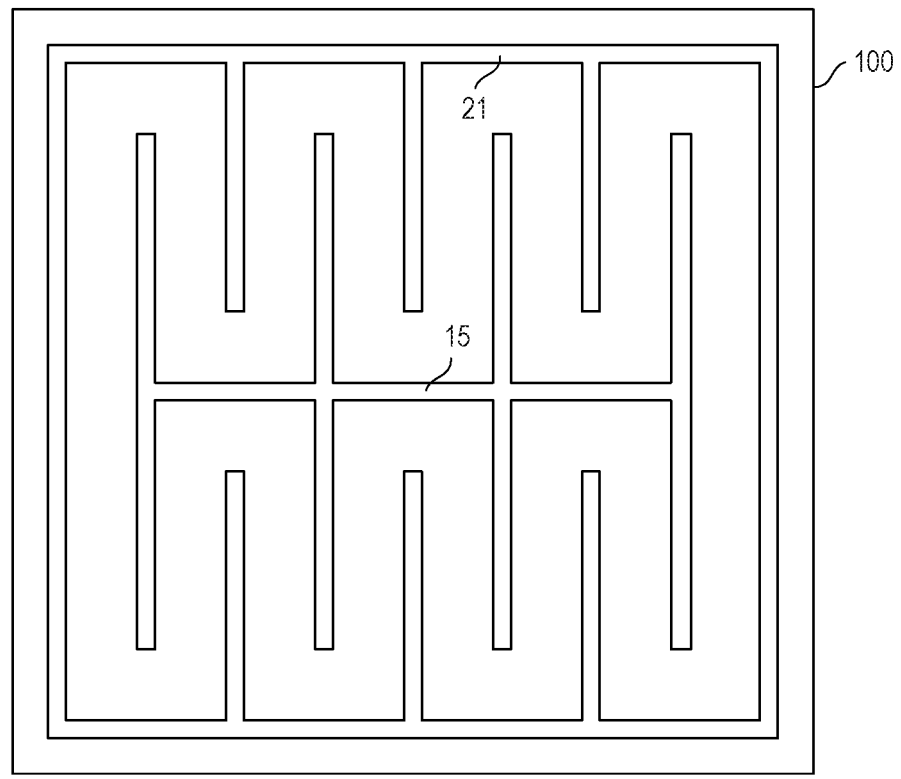

Implementing the first drain region 15 as an elongated region, however, is only an example. The concept illustrated in FIG. 10, in which the first source region 13 surrounds the drain region 15 is also applicable to transistor arrangements in which the first drain region 15 is different from a (single) elongated region. Further examples of how a transistor arrangement of the type shown in FIG. 10 may be implemented are illustrated in FIGS. 11 and 12. Each of these figures shows a top view of a semiconductor body 100. For the ease of illustration, these figures only illustrate the geometry of the first drain region 15 and the second source region 21. The gate regions and the first source region are not shown in FIGS. 11 and 12. As in the example shown in FIG. 10, the gate regions and the first source region, although not shown in FIGS. 11 and 12, are arranged between the first drain region 15 and the second source region 21. In the example shown in FIG. 11, the first drain region 15 essentially has the form of a rake. In the example shown in FIG. 12, the first drain region 15 has the form of several Hs. In both examples, the first drain region 15 includes several longitudinal sections. With regard to the distance between these longitudinal sections and the first source region 13 (not shown in FIGS. 11 and 12) the explanation provided in context with FIG. 10 applies accordingly.

Figure 13:
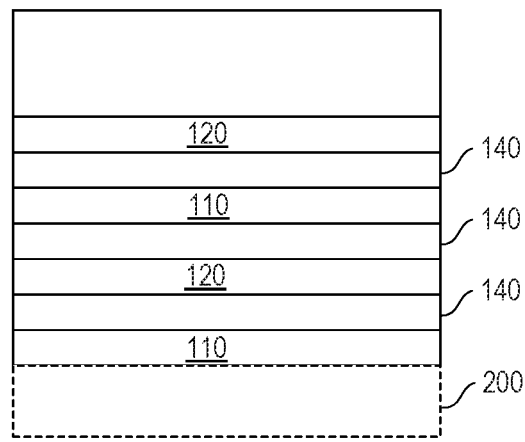
FIG. 13 illustrates one example of drift and compensation regions that are separated by intrinsic regions.

Referring to the examples illustrated herein before, the first layers 110 having the first doping type may adjoin the second layers 120 having the second doping type. Towards any interface between a first layer 110 and a second layer 120, the doping concentration in the first layer 110 decreases towards an intrinsic level, and in the second layer 120, the doping concentration decreases towards the intrinsic level. Thus, inevitably, there is a (narrow) region with an intrinsic doping level between each of the first layers 110 and an adjacent second layer 120. According to another example shown in FIG. 13, there is an intrinsic layer 140 between each of the first layers 110 and the adjacent second layer 120. "Intrinsic" in this context means that the doping concentration is either lower than $1E11$ $cm^{-3}$ or lower than 1% or even lower than 0.5% of a maximum doping concentration of each of the first and second layers 110, 120. A width of these intrinsic layers 140 is wider than necessary to simply separate the first layers 110 from the second layers 120. According to one example, a width of each of these intrinsic layers 140 is between 50% and 150% of a width of a first and second layer 110, 120. The "width" of each of the first and second layers 110, 120 is defined by a shortest distance between the two intrinsic layers 140 bordering the respective first or second layer 110, 120.

When the transistor arrangement is in the off-state and a voltage is applied between the first drain region 15 and the source region 21 of the second device M2, a space charge region (depletion region) expands in the drift regions 11 and the compensation regions 12 in a section between the gate regions 14, which are electrically connected to the source node S2 of the second device M2, and the first drain region 15. This space charge or depletion region is associated with an electric field. In the drift and compensation regions 11, 12, equipotential lines of this electric field are essentially perpendicular to the first surface 101. In order to shape the electric field in the first region 131 such that a voltage blocking capability of the first transistor device M1 in the first region 131 is equal to or higher than the voltage blocking capability in the drift and compensation regions 11, 12 the transistor arrangement may include an edge termination structure in or on top of the first region 131 between the gate regions 14 and the first drain region 15. This edge termination structure may be implemented in various ways. Some examples are explained in the following.

Figure 14:
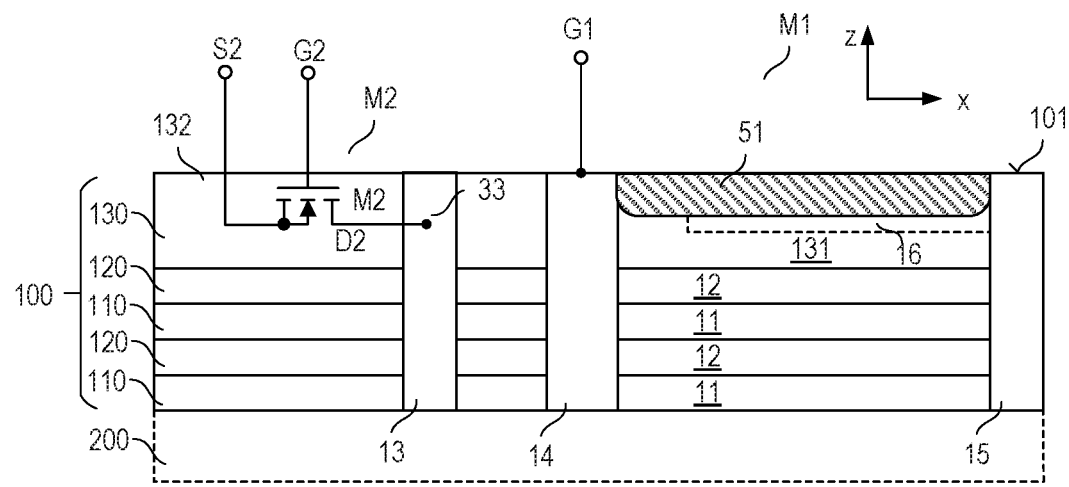
FIGS. 14-18 illustrate different examples of edge termination structures of the first transistor device.

FIG. 14 shows one example of an edge termination structure. In this example, the edge termination structure includes an insulation layer 51 that extends into the semiconductor body 100 between the gate regions 14 and the first drain region 15. This insulation layer 51 may be implemented as an STI (Shallow Trench Isolation). A thickness of the insulation layer 51 in the vertical direction z is, for example, between 200 nanometers and 1.5 micrometers. The insulation layer 51 includes an electrical insulating material. Examples of the electrically insulating material include, but are not restricted, an oxide, a nitride, or a combination thereof. According to one example, the insulation layer 51 includes a thermally grown oxide. The insulation layer 51 may adjoin at least one of the first drain region 15 and the gate regions 14. In the example shown in FIG. 14, the insulation layer 51 adjoins the gate regions 14 and the first drain region 15 so that the insulation layer 51, in the first lateral direction x, extends from the gate regions 14 to the first drain region 15.

Optionally, the edge termination structure includes a compensation region 16 (illustrated in dashed lines in FIG. 14) of the first doping type in the first region 131. The compensation region 16 adjoins the first drain region 15. In the first lateral direction x, the compensation region 16 may be spaced apart from the gate regions 14 (as shown in FIG. 14). According to another example, the compensation region 16 extends from the first drain region 15 to the gate regions 14. An effective doping concentration of the compensation region 16 may be equal to or higher than the basic doping concentration of the first region 131.

Figure 15:
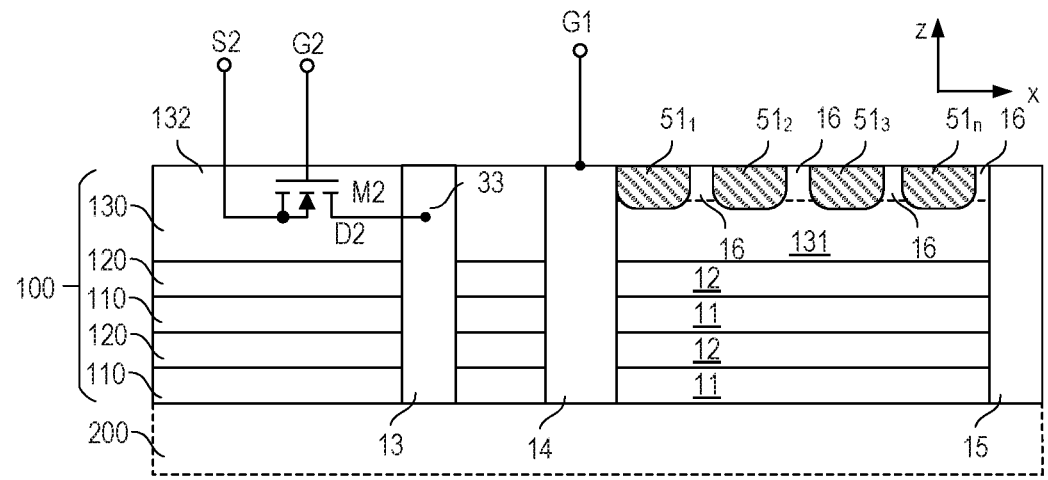

FIG. 15 shows a modification of the edge termination structure shown in FIG. 14. In the example shown in FIG. 15, the edge termination structure includes several insulation layers $51_1$-$51_n$ that extend into the semiconductor body 100. With regard to the material and the depths, these insulation layers $51_1$-$51_n$ may be implemented in the same fashion as the insulation layer 51 explained with reference to FIG. 14. In the first lateral direction x, the several insulation layers $51_1$-$51_n$ are mutually spaced apart from each other. In the example shown in FIG. 15, there are four insulation layers $51_1$-$51_n$ arranged in the first region 131 between the gate regions 14 and the first drain region 15. This, however, is only an example. More generally, the number of insulation layers $51_1$-$51_n$ is selected from between 2 and 100. A distance between two neighboring insulation layers $51_1$-$51_n$ is for, example, between 50 nanometers (nm) and 500 nm.

Referring to FIG. 15, the edge termination structure may further include a compensation region 16 of the first doping type. In the example shown in FIG. 15, the compensation region 16, in the first lateral direction x, extends from the drain region 15 to the gate regions 14. Further, the compensation region 16 extends to the first surface 101 of the semiconductor body 100 between the insulation layers $51_1$-$51_n$ (which may also be referred to as insulation regions).

Figure 16:
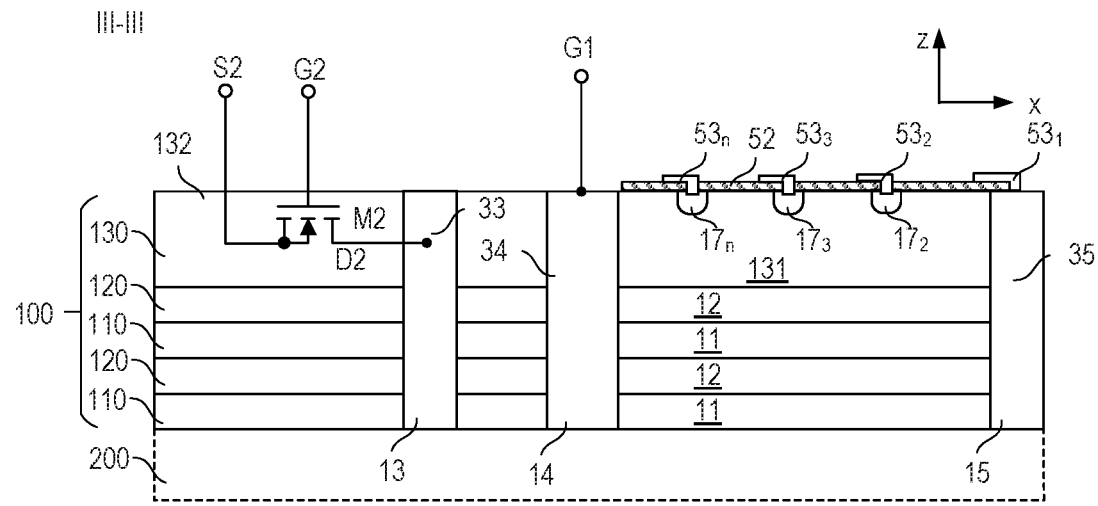

FIG. 16 shows an edge termination structure according to another example. In this example, the edge termination structure includes several field plates $53_1$-$53_n$ and several field regions $17_2$-$17_4$ of the first doping type. In this example, one field plate $53_1$ is connected to the drain region 15. Each of the other field plates $53_3$-$53_n$ is connected to one of the field regions $17_2$-$17_n$. The field plates $53_1$-$53_n$ and field regions $17_2$-$17_n$ are spaced apart from each other in the first lateral direction x. In the example shown in FIG. 16, each of the field plates $53_1$-$53_n$ includes a plate-like region that is separated from the semiconductor body 100 by an insulation layer 52. A plug extends through the insulation layer 52 and connects each of the field plates $53_2$-$53_n$ to the respective field region $17_2$-$17_n$. According to one example, doping concentrations of the field regions $17_2$-$17_n$ are such that these field regions $17_2$-$17_n$ cannot completely be depleted when the first transistor device is in the off-state.

Figure 17:
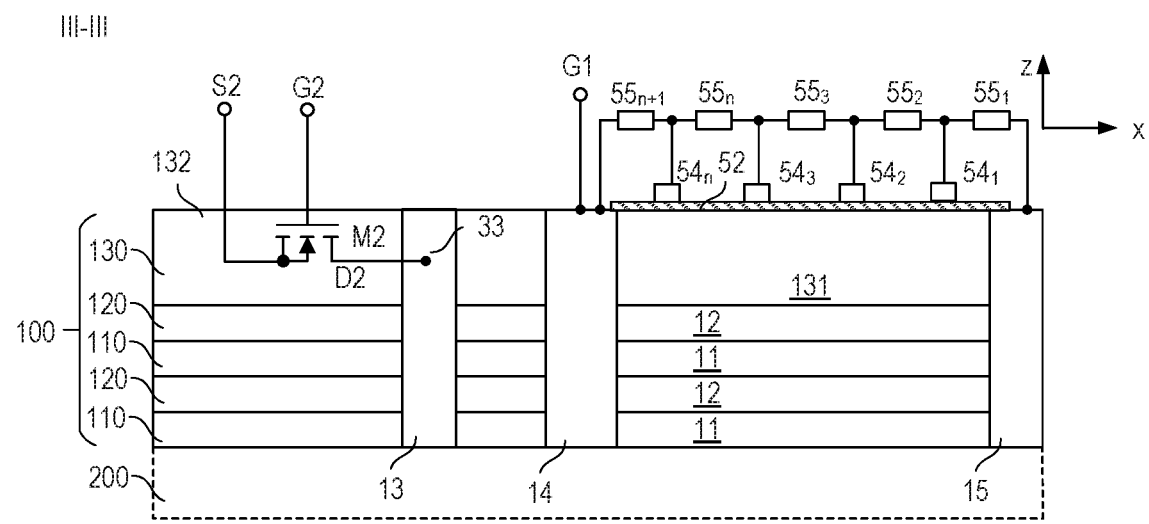

FIG. 17 shows another example of an edge termination structure. In this example, several field plates $54_1$-$54_n$ are arranged on an insulation layer 52 on top of the first region 131. Each of the field plates $54_1$-$54_n$ is connected to a tap of a resistive voltage divider $55_1$-$55_{n+1}$ that is connected between at least one of the gate regions 14 and the first drain region 15.

Figure 18:
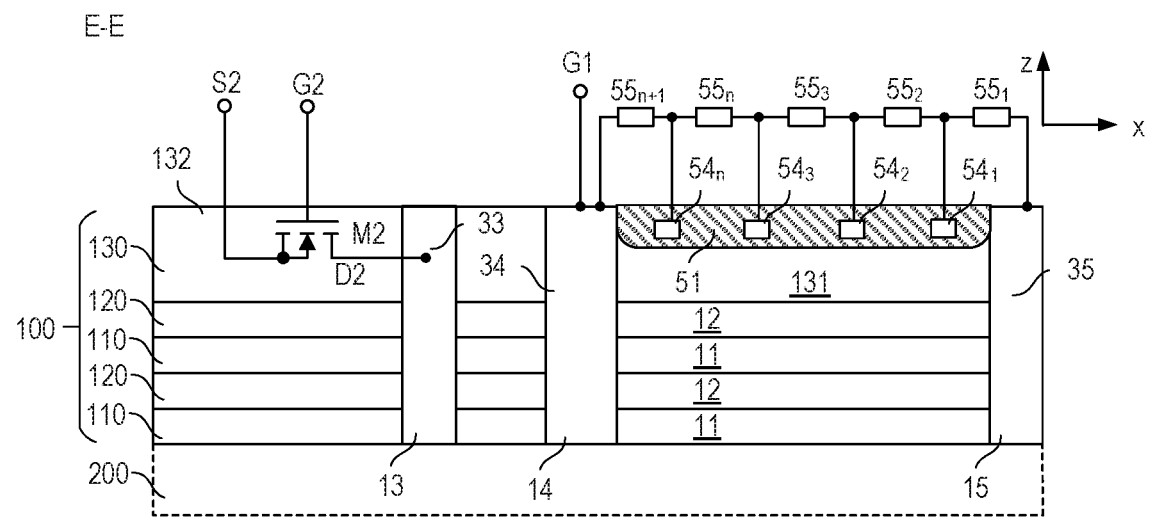

FIG. 18 shows a modification of the edge termination structure shown in FIG. 17. In the example shown in FIG. 18, the field plates $54_1$-$54_n$ are arranged in an insulation layer 51 that extends into the first region 131. This insulation layer 51 can be of the same type as the insulation layer 51 explained with reference to FIG. 14.

Figure 19:
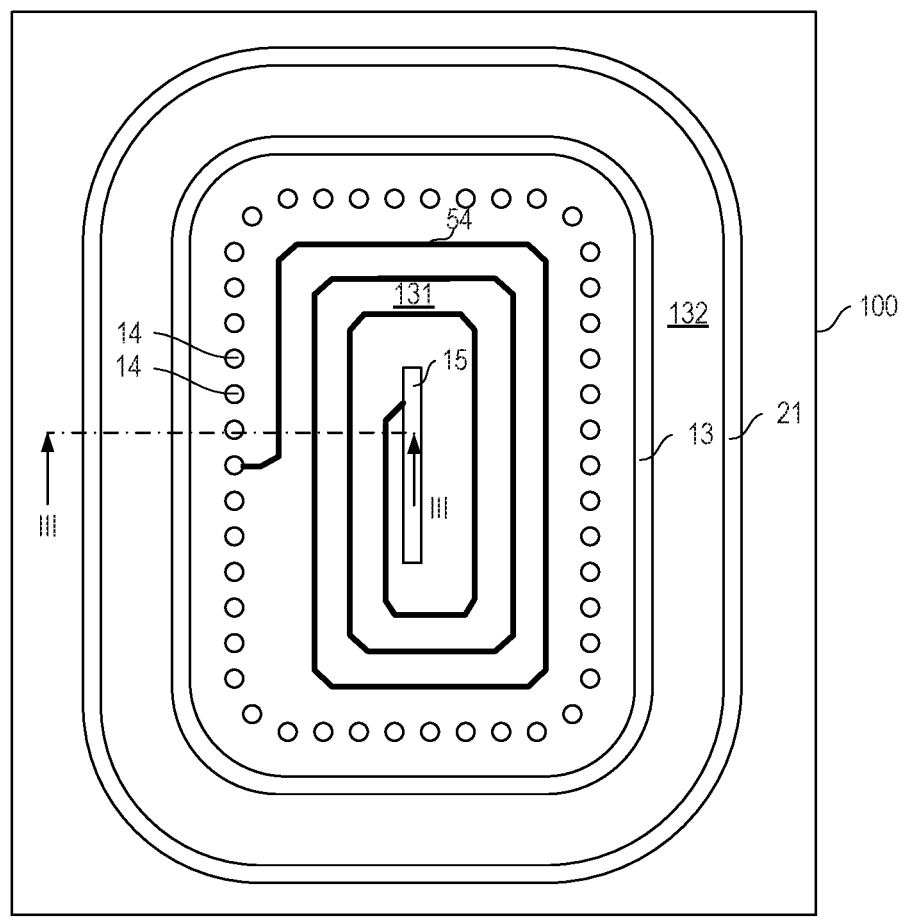
FIG. 19 shows a top view of an edge termination structure according to one example.

FIG. 19 shows a top view of a transistor arrangement that is of the type explained with reference to FIG. 10 and includes an edge termination structure according to the type illustrated in FIG. 17 or 18. Referring to FIG. 19, the edge termination structure includes a spiral-shaped resistive conductor 54 that is connected to one of the gate regions 14 (and, therefore, the first gate node G1) and to the first drain region 15. The spiral-shaped conductor 54 includes several turns around the drain region 15. According to one example, the conductor 54 is made from a highly resistive material. This conductor 54 forms, in equal measure, both the resistive voltage divider $55_1$-$55_5$ and the field plates $54_1$-$54_4$. FIGS. 16 and 17 represent a vertical cross sectional view of the transistor arrangement in a vertical section plane shown in FIG. 19. The conductor 54 includes, for example, an undoped polycrystalline or amorphous semiconductor material such as silicon. According to one example, a resistance of the conductor 54 is greater than 10 megaohms, greater than 100 megaohms, or greater than 500 megaohms.

Referring to the above, the semiconductor body 100 with the first and second semiconductor layers 110, 120 and the third semiconductor layer 130 may be arranged on a carrier 200. This carrier 200 may be implemented in various ways. Some examples of how the carrier may be implemented are explained in the following.

Figure 20:
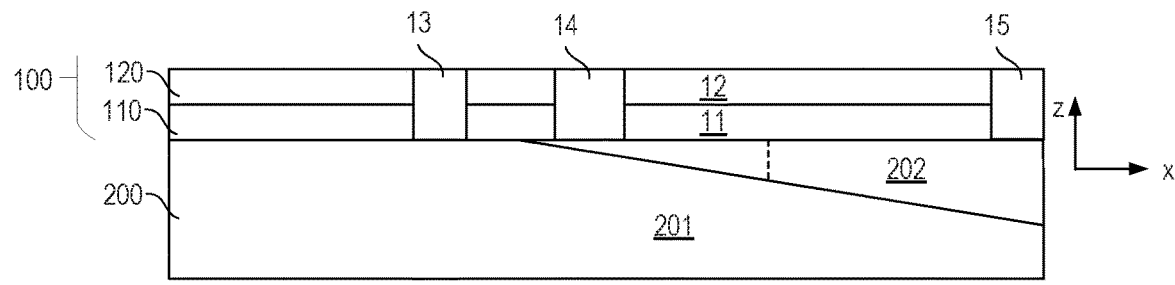
FIGS. 20-24 shows different examples of a carrier of the transistor arrangement.

FIG. 20 shows a first example of the carrier 200. In this example, the carrier 200 is made of a semiconductor material. According to one example, the semiconductor material of the carrier 200 is the same semiconductor material as the semiconductor material of the semiconductor body 100 arranged on top of the carrier 200.

In the example shown in FIG. 20, the first drain region 15 and the first source region 13, in the semiconductor body 100, extend down to the carrier 200. In order to avoid a short-circuit between the first drain region 15 and the first source region 13 in the carrier 200, the carrier 200 includes a p-n junction between the first drain region 15 and the first source region 13. This p-n junction is formed between a first carrier region 201 of the second doping type and a second carrier region 202 of the first doping type. The first carrier region 201 adjoins the first source region 13, and the second carrier region 202 adjoins the first drain region 15. Referring to FIG. 20, the second carrier region 202, in the first lateral direction x, may extend along an interface between the carrier 200 and the semiconductor body 100 to the gate regions 14 (from which only one is shown in FIG. 20) or beyond the gate regions 14. This, however, is only an example. According to another example (illustrated in dashed lines in FIG. 20) the second carrier region 202 may end spaced apart from the gate regions 14. According to one example, the second carrier region 202 is implemented such that a dimension of the second carrier region 202 in the vertical direction z decreases as a distance from the first drain region 15 increases. In the example illustrated in FIG. 20, the vertical dimension of the second carrier region 202 linearly decreases as the distance from the first drain region 15 increases. This, however, is only an example. According to another example, the vertical dimension of the second carrier region 202 decreases non-linearly as the distance from the drain region 15 increases.

Figure 21:
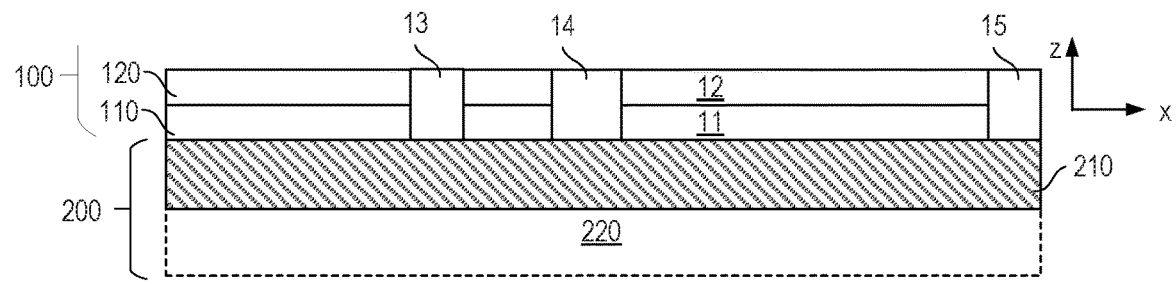

FIG. 21 shows a carrier 200 according to another example. In this example, the carrier 200 includes an insulation layer 210 that adjoins the semiconductor body 100 and an optional semiconductor substrate 220 (illustrated in dashed lines) on which the insulation layer 210 is arranged. The substrate 220 can be omitted so that the carrier 200 may only consist of the insulation layer 210. As in the example shown in FIG. 20, each of the first source regions 13, the first drain region 15 and the gate regions 14 extends down to the carrier 200 in the semiconductor body 100. In the example shown in FIG. 21, the insulation layer 210 provides for an insulation between the first source regions 13 and the first drain region 15 in the carrier 200.

Figure 22:
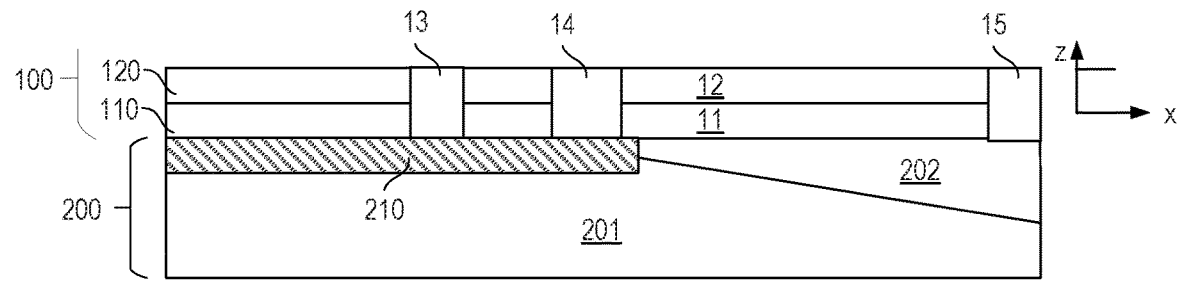

FIG. 22 shows another example of the carrier 200. The carrier 200 shown in FIG. 22 includes features from both the example shown in FIG. 20 and the example shown in FIG. 21. More specifically, the carrier 200 includes the first carrier region 201 and the second carrier region 202 explained with reference to FIG. 20. Additionally, the insulation layer 210 is arranged between the first carrier region 201 and the semiconductor body 100.

Figure 23:
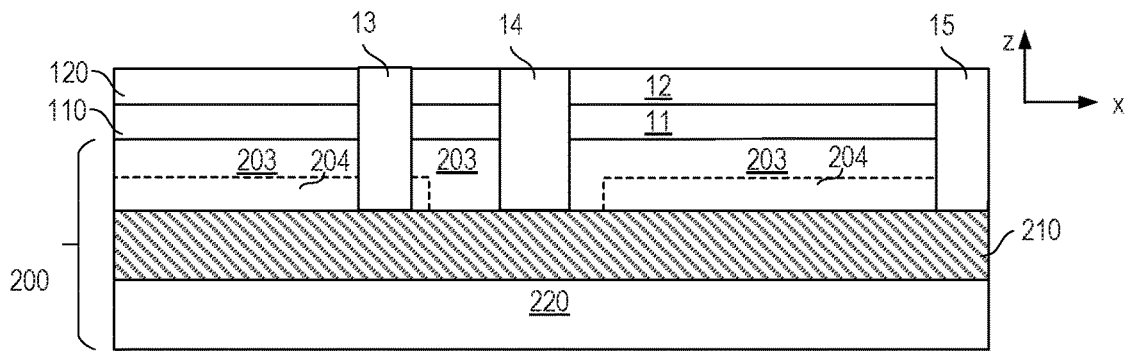

FIG. 23 shows a modification of the carrier 200 shown in FIG. 21. In the example shown in FIG. 23, a semiconductor layer 203 of the second doping type is arranged between the insulation layer 210 and the layer stack with the first and second semiconductor regions 110, 120. The first source regions 13, the gate regions 14, and the first drain region 15 may extend through this layer 203 of the carrier 200 down to the insulation layer 210. Optionally, semiconductor regions 204 are arranged in the layer 203. These semiconductor regions 204 have the first doping type and may adjoin the insulation layer 210. Each of these regions 204 is connected to at least one of the first source regions 13 and the first drain region 15.

Figure 24:
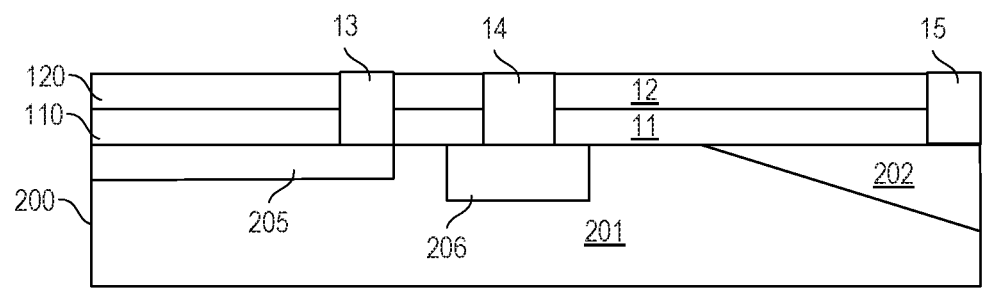

FIG. 24 shows another example of the carrier 200. In this example, a third carrier region 205 of the first doping type adjoins the first source region 13, and a fourth carrier region 206 of the first doping type adjoins the gate regions 14. The second carrier region 202, the third carrier region 205 and the fourth carrier region 206 are spaced apart from each other and separate from each other by the first carrier region 201. Thus, two p-n junctions are arranged between each of the second, third and fourth carrier regions 202, 205, 206 and another one of the second, third, and fourth carrier regions 202, 205, 206. In this carrier 200, the fourth carrier region 206 below the gate regions 14 can be used to adjust the shape of the electric field in the carrier 200. The third carrier region 205 may have a doping concentration that is high enough to act as a shield that protects the second region 132 of the third layer 130 from an electric field that may occur in the carrier 200.

Figure 25:
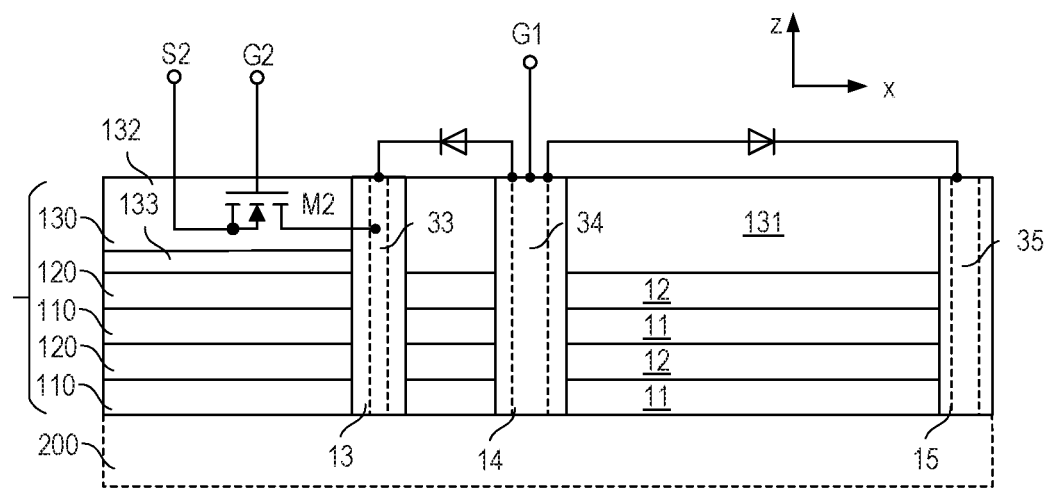
FIG. 25 illustrates a modification of the transistor device shown in FIGS. 1A-1C.

FIG. 25 shows a transistor arrangement according to another example. In this example, a semiconductor region 133 of the first doping type is arranged between the second region 132 in which active regions of the second transistor device M2 are integrated and the layer stack with the first semiconductor layers 110 and the second semiconductor layers 120. This region 133 of the first doping type may act as a compensation region. Alternatively, region 133 can be highly doped and act as a shield, similar to the third region 205 shown in FIG. 24, that protects the second region 132 and the second transistor device 132 integrated therein.

Figure 26:
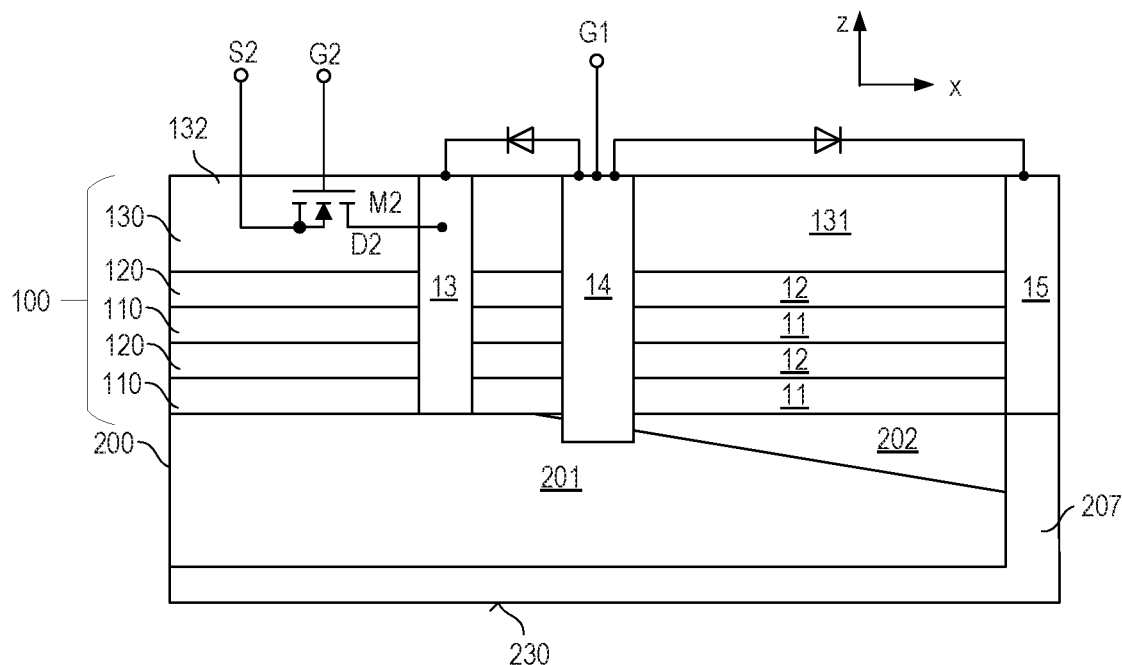
FIG. 26 shows a vertical cross sectional view of a transistor arrangement with a drain down first transistor device.

Referring to FIG. 26, the first transistor device can be implemented as a drain-down transistor. In this case, the carrier 200 includes a drain region extension 207 at a first surface 230 of the carrier 200. The first surface 230 of the carrier 200 faces away from the first surface 101 of the semiconductor body 100. The drain extension region further includes a connection region of the first doping type that connects the drain extension region 207 to the first drain region 15. In the example shown in FIG. 26, the carrier 200 further includes a first carrier region 201, and a second carrier region 202 as explained herein before. This, however, is only an example. Other topologies of the carrier may be used as well.

Figure 27:
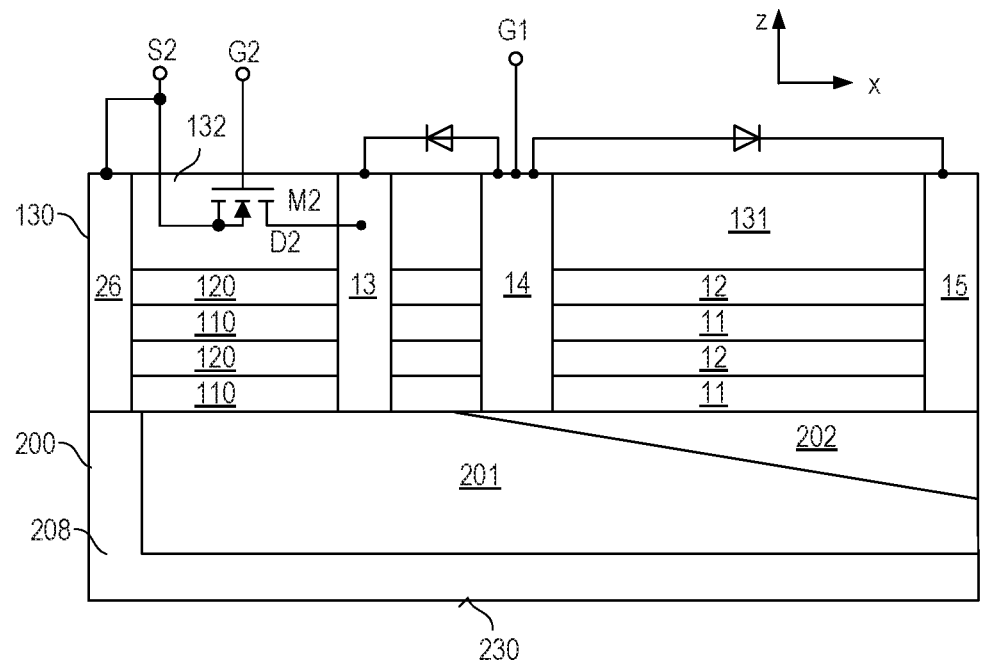
FIG. 27 shows a vertical cross sectional view of a transistor arrangement with a source down first transistor device.

FIG. 27 shows a modification of the transistor arrangement shown in FIG. 26. In this example, the second source region 21 can be contacted via the first surface 201 of the carrier 200. In this example, the carrier 200 includes a source extension region 208 along the first surface 230 of the carrier 200. Further, the source extension region 208 adjoins a contact region 26 of the first doping type. This contact region 26 extends through the layer stack with the first and second semiconductor layers 110, 120 down to the carrier 200. Further, this contact region 26 is connected to the source region of the second transistor device M2. This second transistor device M2 is only schematically illustrated in FIG. 27. How the contact region 26 may be connected to the second source region 21 is illustrated in FIGS. 3A to 3B, 4, 5, and 6A to 6B in which the contact region 26 is illustrated in dashed lines.

Figure 28:
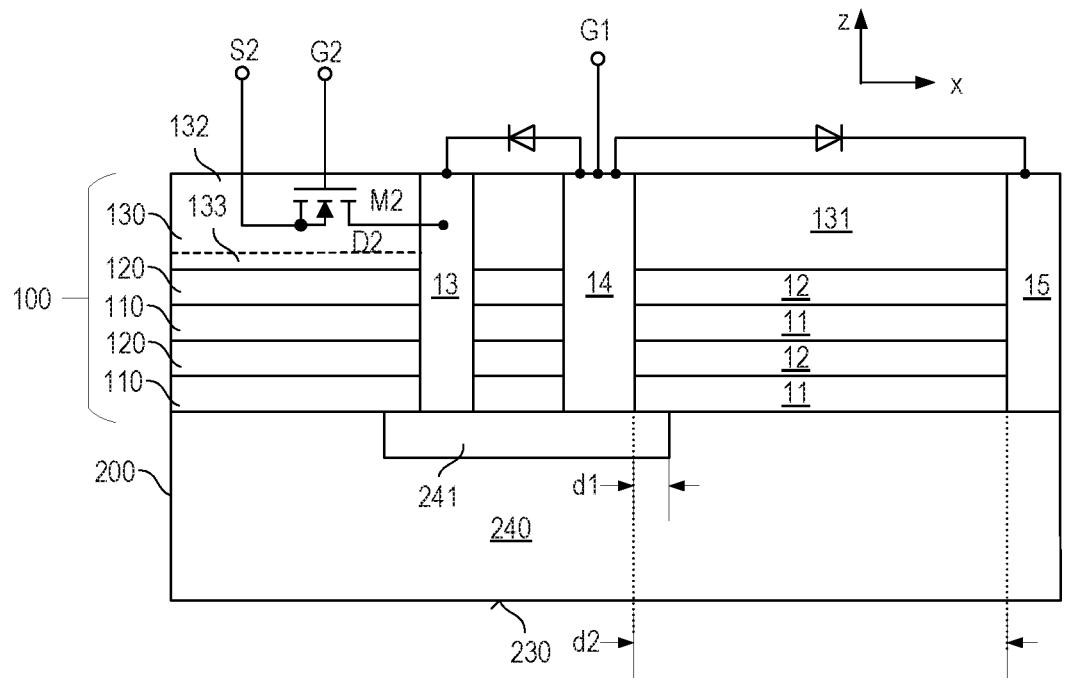
FIGS. 28-31 show vertical cross sectional views of transistor arrangements with carriers according to further examples.

FIG. 28 shows a carrier 200 according to another example. In this example, the carrier 200 includes a semiconductor layer 240 and a buried semiconductor region 241 in the semiconductor layer 240. The semiconductor layer 240 may be implemented as a semiconductor substrate and is referred to as semiconductor substrate in the following. However, it is also possible that the semiconductor layer 240 is an epitaxial layer grown on another semiconductor layer or a semiconductor substrate, or that the semiconductor layer 240 is formed on an insulator.

The buried semiconductor region 241 adjoins the lowermost layer of the layer stack 100 and is in contact with the first source region 13 and the gate regions 14. In the first lateral direction x, the buried region at least extends from the first source region 13 to the gate regions 14. The buried region 241 may extend beyond the gate regions 14 towards the drain region 15, but does not extend to the drain region 15. According to one example, a distance d1 the buried region 241 extends beyond the gate regions 14 towards drain region 15 is less than 60%, less than 20%, less than 10%, or even less than 5% of a (shortest) distance d2 between the gate regions 14 and the drain region 15.

Referring to FIG. 28, the buried region 241 may overlap the second region 132. That is, as seen from the gate regions 14, the buried region 241 may extend beyond the source region 13 in the lateral direction x. Referring to the above, the second transistor M2 is integrated in the second region 132. This second transistor M2 is only represented by its circuit symbol in FIG. 28. Referring to the above the second transistor M2 includes a source region 21 which is illustrated in FIGS. 3A-3B and 4-7, for example. According to one example, the buried region 241 slightly extends beyond the first source region 13, as illustrated in FIG. 28. In particular, the buried region 241 may extend beyond the first source region 13 only to such an extent that it does not overlap the source region 21 of the second transistor device M2 in the lateral direction x.

Figure 29:
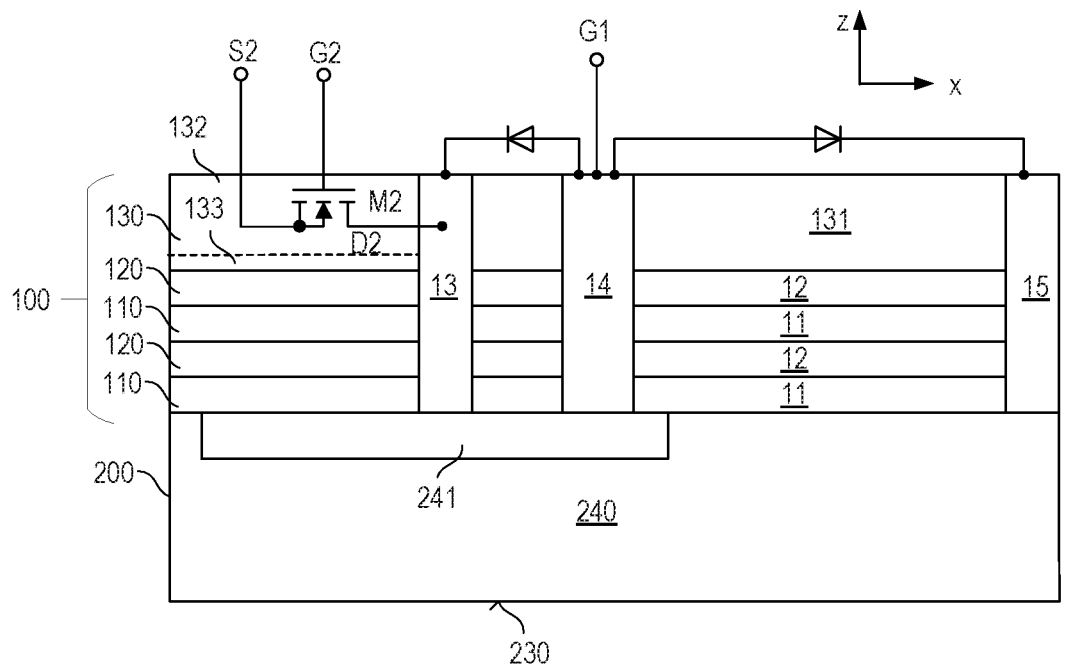

According to another example illustrated in FIG. 29 the buried region 241 significantly extends beyond the first source region 13. In particular, the buried region 241 may extend beyond the first source region 13 to such an extent that the buried region 241 overlaps the source region 21 of the second transistor device M2, that is, a vertical projection of the source region 21 onto the carrier 200 and the buried region 241 overlap.

The buried region 241 may be formed in the substrate 240 by an implantation and/or diffusion process before the layer stack 100 is formed on top of the carrier 200. A dimension of the buried region 241 in the first lateral direction x is between 0.5 micrometers (µm) and 10 micrometers, in particular, between 4 micrometers and 8 micrometers, for example. A doping concentration of the buried region 241 is selected from between $1E15$ cm$^{-3}$ and $1E17$ cm$^{-3}$, for example, and a dopant dose (which is the integral of the doping concentration in the vertical direction z) is selected from between $3E12$ cm$^{-2}$ and $6E13$ cm$^{-2}$, for example. A doping concentration of the substrate is selected from between $5E13$ cm$^{-3}$ and $2E14$ cm$^{-3}$ for example. According to one example, the buried region 241 is implemented such that the dopant dose decreases towards its lateral ends, wherein the "lateral ends" are ends in the first (and second) lateral direction x (and y).

The buried region 241 may have the first doping type or the second doping type. When the buried region 241 has the second doping type it is electrically connected to the gate regions 14 and there is a pn-junction between the buried region 241 and the first source region 13, and when the buried region 241 has the first doping type it is electrically connected to the first source region 13 and there is a pn-junction between the buried region 241 and the gate regions 14. Thus, the buried region is either connected to the first source region 13 or the gate regions 14. In each case, the buried region 241 acts as a field plate that may affect the shape of the electric field in the layer stack 100.

The substrate 240 may have the first doping type. According to one example, the buried region 241 has the second doping type and the substrate 240 has the first doping type or the second doping type. According to another example, the buried region 241 has the first doping type and the substrate has the second doping type. In each case there is at least one pn-junction between the first source region 13 and the drain region 15 that is reverse biased when the superjunction transistor device is in the blocking state.

Figure 30:
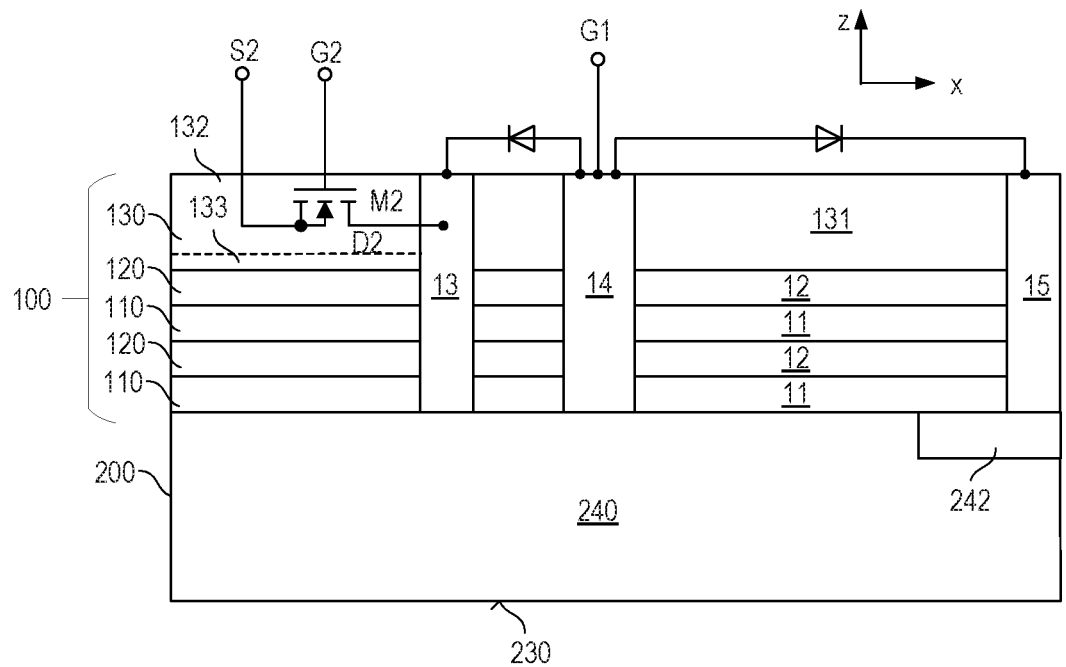

FIG. 30 illustrates a modification of the transistor arrangement shown in FIGS. 28 and 29. In the transistor arrangement shown in FIG. 30, the carrier 200 includes another buried region 242. This buried region 242 is referred to as second buried region and the buried region 241 explained above is referred to as first buried region in the following. The second buried region 242 is in contact with the first drain region 15. The second buried region may extend beyond the first drain region 15 towards the gate regions 14, and, therefore, adjoin the lowermost layer of the layer stack 100. A doping concentration and a dopant dose of the second buried region 242 may be in the same range as the doping concentration and the dopant dose, respectively, of the first buried region 241.

According to one example, the second buried region 242 is of the first doping type, that is, the same doping type as the first drain region 15. Referring to FIG. 30, the transistor arrangement may be implemented with the second buried region 242, but without the first buried region 241. In this examples, sections of the substrate 240 that have the basic doping concentration of the substrate 240 adjoin the first source region 13 and the gate regions 14. The substrate 240 may have the second doping in this example, so that there is at least one pn-junction between the drain region 15 and the first source region 13 and between the drain region 15 and the gate regions 14 that is reverse biased when the superjunction transistor device is in the blocking state.

Figure 31:
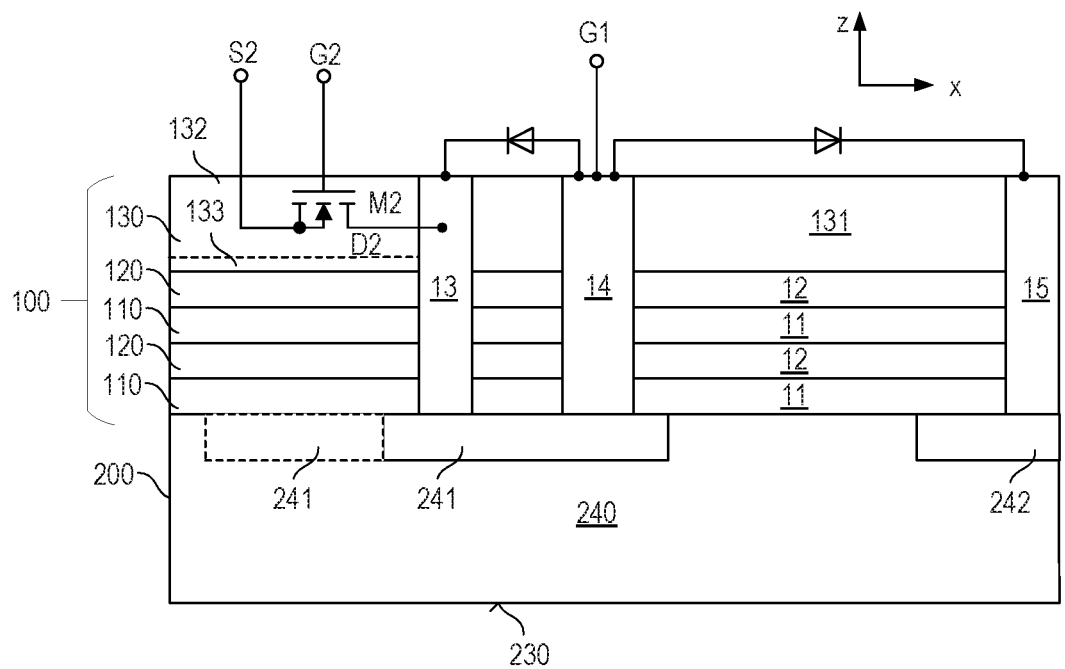

FIG. 31 shows a modification of the transistor arrangement shown in FIG. 30, In the transistor arrangement shown in FIG. 31, both the first buried region 241 and the second buried region 242 are implemented in the carrier 200. According to one example, the first buried region 241 has the second doping type and the substrate 240 has the first doping type or the second doping type. According to another example, the first buried region 241 has the first doping type and the substrate 240 has the second doping type. Referring to FIG. 31, the second buried layer 242 may be spaced apart from the first buried layer. According to another example (not shown), the second buried layer 242 extends towards the first buried layer 241 such that the second buried layer 242 adjoins the first buried layer 241.

In the examples illustrated in FIGS. 28 to 31, the lowermost layer of the layer stack 100 is a first layer 110, that is, a layer of the first doping type. This, however, is only an example. According to another example (not illustrated), the lowermost layer of the layer stack is a second layer, that is, a layer of the second doping type. Further, the semiconductor region 133 of the first doping type that is explained with reference to FIG. 25 above is optional in the examples illustrated in FIGS. 28 to 31.

Figure 32A:
FIGS. 32A-32C illustrate one example of a method for forming a semiconductor body of the transistor arrangement.
Figure 32B:
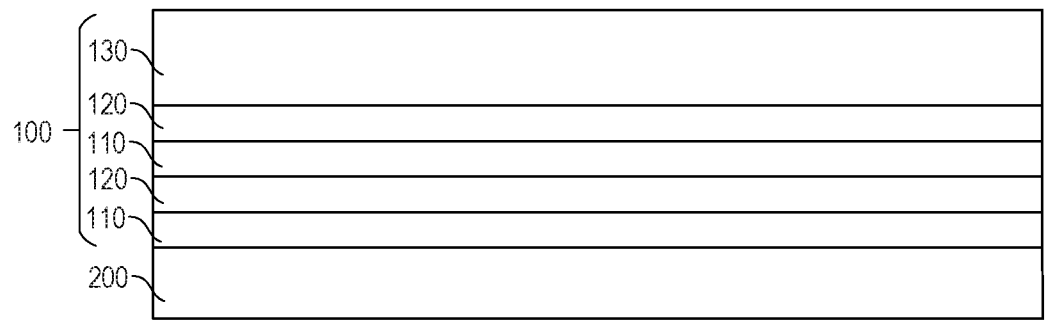
Figure 32C:
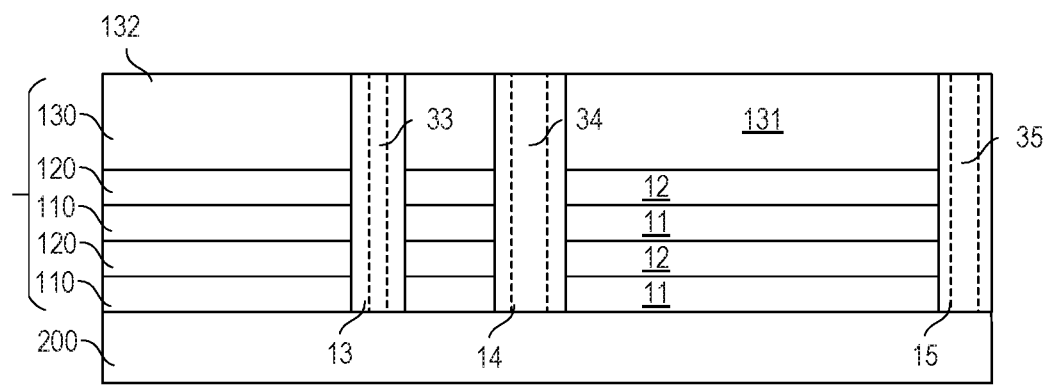

FIGS. 32A to 32C illustrate one example of a method for forming the semiconductor body 100 with the first, second and third layers 110, 120, 130, the first source regions 13, the first drain regions 15 and the first gate regions 14. Each of these figures shows a vertical cross sectional view of the arrangement during different process steps.

Referring to FIG. 32A, the method includes providing the carrier 200. The carrier may be implemented in accordance with any of the examples explained herein before.

Referring to FIG. 32B, the method further includes forming the semiconductor body 100 on top of the carrier 200. Forming the semiconductor body 100 may include one or more epitaxial processes in which the first and second semiconductor layers 110, 120 and the third semiconductor layer 130 are subsequently grown on the carrier 200. Forming the semiconductor body 100 may include one epitaxial process in which the semiconductor body 100 may be in-situ doped in order to form the first and second semiconductor layers 110, 120 and the third semiconductor layer 130. The differently doped semiconductor layers 110, 120, 130 can be obtained in this process by varying the type and the flow rate of a dopant atom including gas in the epitaxial growth process. This gas includes dopants of one of the first and second doping types, so that by suitably selecting the type of gas either an n-type or a p-type layer is formed. Further, the doping concentration of the respective layer can be adjusted by adjusting the flow rate of the gas in the epitaxial growth process. An intrinsic layer can be formed by omitting the gas including the dopant atoms.

According to another example, forming the semiconductor body 100 with the first, second and third layers 110, 120, 130 includes a multi-epitaxial process in which a plurality of epitaxial layers are grown one above the other. In each but an uppermost of these epitaxial layers at least one layer pair with a first layer 110 and a second layer 120 are formed using at least one implantation process. These epitaxial layers can be undoped. In this case, forming each of the first and second layers 110, 120 in each of the epitaxial layers includes an implantation process. According to another example, each of these epitaxial layers has a basic doping of one of the first and second doping type. In this case, only a first type of layer, the first layer(s) 110 or the second layer(s), is formed by the implantation process, while the second type of layer is formed by those sections in which the basic doping remains after forming the layer(s) of the second type. Two or more layers of the same type, first layers 110 or second layers 120, may be formed spaced apart from each other in the vertical direction z in each of the epitaxial layers. In the uppermost epitaxial layer the third layer 130 is formed. According to one example, only the third layer 130 is formed by the uppermost epitaxial layer, either by in-situ doping the uppermost epitaxial layer during the growth process, or by an implantation process. According to another example, the third layer 130 and at least one pair with a first layer 110 and a second layer 120 is formed in the uppermost epitaxial layer 130.

FIG. 32C shows the arrangement with the carrier 200 and the semiconductor body 100 after further process steps in which the first source region 13, the first drain region 15 and the gate regions 14 are formed. Forming these regions may include forming trenches in the semiconductor body 100 down to the carrier 200 and introducing dopant atoms into the sidewalls of these trenches either by an implantation process or by filling the trenches with a highly doped polycrystalline semiconductor material of the respective doping type and diffusing dopant atoms from the filling material into the semiconductor body 100. The polycrystalline material may remain in the trenches and form the first, second and third electrodes 34, 35, 33, which may also be referred to as gate contact electrode 34, drain contact electrode 35, and source contact electrode 33.

According to one example, the third layer 130 is deposited as an intrinsic layer and the first and second regions 131, 132 are formed by an implantation process in which dopant atoms of the second doping type are implanted into the first surface 101 of the semiconductor body 100. In order to obtain differently doped first and second regions 131, 132 two different implantation processes, each using an implantation mask, may be used.

Referring to the above, the second transistor M2 is formed in the second region 132 in order to obtain a second transistor of any of the types explained herein before. Forming the second transistor M2 may include conventional processes for forming transistor devices in a CMOS technology.

Although the present disclosure is not so limited, the following numbered examples demonstrate one or more aspects of the disclosure.

Example 1

A transistor arrangement, comprising: a layer stack with a plurality of first semiconductor layers of a first doping type and a plurality of second semiconductor layers of a second doping type complementary to the first doping type; a first source region of a first transistor device adjoining the plurality of first semiconductor layers; a first drain region of the first transistor device adjoining the plurality of second semiconductor layers and spaced apart from the first source region in a first direction; a plurality of gate regions of the first transistor device, wherein each of the plurality of gate regions adjoins at least one of the plurality of second semiconductor layers, is arranged between the first source region and the first drain region, and is spaced apart from the first source region and the first drain region; a third semiconductor layer adjoining the layer stack and each of the first source region, the first drain region, and the gate regions; and active regions of a second transistor device integrated in the third semiconductor layer in a second region that is spaced apart from a first region of the third semiconductor layer, wherein the first region is bordered by the first source region and the first drain region and has the second doping type.

Example 2

The transistor arrangement of example 1, wherein a doping concentration of the first region of the third semiconductor layer is lower than a doping concentration of the plurality of second semiconductor layers.

Example 3

The transistor arrangement of example 1 or 2, wherein a doping concentration of the second region of the third semiconductor layer is higher than a doping concentration of the first region.

Example 4

The transistor arrangement of one of the preceding examples, wherein a thickness of the third semiconductor layer is at least twice a thickness of a single one the first semiconductor layers or a single one of the second semiconductor layers.

Example 5

The transistor arrangement of one of the preceding examples, wherein a thickness of the third semiconductor layer is greater than a distance between the first source region and each of the gate regions.

Example 6

The transistor arrangement of one of examples 1 to 5, wherein the first semiconductor layers and the second semiconductor layers are parallel to the third semiconductor layer.

Example 7

The transistor arrangement of one of examples 1 to 5, wherein the first semiconductor layers and the second semiconductor layers are perpendicular to the third semiconductor layer.

Example 8

The transistor arrangement of any one of the preceding examples, wherein the active regions of the second transistor device include: a second source region of the first doping type; a second drain region of the first doping type spaced apart from the second source region; and a body region of the second doping type adjoining the second source region and arranged between the second source region and the second drain region, and wherein the second transistor device further includes a gate electrode adjacent the body region and dielectrically insulated from the body region by a gate dielectric.

Example 9

The transistor arrangement of example 8, wherein the second transistor device further includes: a drift region of the first doping type arranged between the body region and the second drain region.

Example 10

The transistor arrangement of any one of the preceding examples, further comprising: a connection region of the second doping type, wherein the connection region adjoins each of the second semiconductor layers and is connected to a source node of the second transistor device.

Example 11

The transistor arrangement of any one of examples 8 to 10, wherein the second source region is electrically connected to each of the gate regions.

Example 12

The transistor arrangement of any one of the preceding examples, wherein the first source region, in a horizontal plane of the layer stack, forms a ring around the first drain region.

Example 13

The transistor arrangement of any one of the preceding examples, further comprising a carrier, wherein the layer stack is arranged on top of the carrier.

Example 14

The transistor arrangement of example 13, wherein each of the first source region, the gate regions and the first drain region extend through the third layer and the layer stack to the carrier.

Example 15

The transistor arrangement of example 13 or 14, wherein the carrier includes: a first carrier region adjoining the first source region and a second carrier region adjoining the first drain region and separating the first drain region from the first carrier region, wherein a p-n junction is formed between first carrier region and the second carrier region.

Example 16

The transistor arrangement of example 13 or 14, wherein the carrier includes an insulation layer.

Example 17

The transistor arrangement of example 16, wherein the carrier further includes a semiconductor layer, and wherein the semiconductor layer adjoins the insulation layer at a side facing away from the layer stack.

Example 18

The transistor arrangement of example 17, wherein the insulation layer adjoins the layer stack.

Example 19

The transistor arrangement of example 16, wherein a semiconductor layer is arranged between the insulation layer and the layer stack.

Example 20

The transistor arrangement of example 14, wherein the carrier includes: a semiconductor layer; a first buried region in the semiconductor layer, wherein the first buried region adjoins the first source region and the gate regions.

Example 21

The transistor arrangement of example 20, wherein the first buried region has the second doping type and the semiconductor layer either has the second doping type or the first doping type, or wherein the first buried region has the first doping type and the semiconductor layer has the second doping type.

Example 22

The transistor arrangement of any one of examples 14 and 20 to 21, wherein the carrier includes: a second buried region of the first doping type in the semiconductor layer, wherein the second buried region adjoins the first drain region.

Example 23

The transistor arrangement of any one of the preceding examples, further comprising: an edge termination structure in or on top of the first region of the third layer.

Example 24

A method comprising: forming a semiconductor body on top of a carrier, wherein the semiconductor body includes a layer stack with a plurality of first layers of a first doping type and a plurality of second layers of a second doping type complementary to the first doping type and a third layer on top of the layer stack; forming a first source region of a first transistor device such that the first source region adjoins the plurality of first semiconductor layers; forming a first drain region of the first transistor device such that the first drain region adjoins the plurality of first semiconductor layers and is spaced apart from the first source region in a first direction; forming a plurality of gate regions of the first transistor device such that each of the plurality of gate regions adjoins at least one of the plurality of second semiconductor layers, is arranged between the first source region and the first drain region, and is spaced apart from the first source region and the first drain region; forming active regions of a second transistor device in a second region of the third layer, wherein the second region is spaced apart from a first region of the third semiconductor layer, wherein the first region is bordered by the first source region and the first drain region.

Example 25

The method of example 24, wherein forming the semiconductor body includes one epitaxial growth process.

What is claimed is:
1. A transistor arrangement, comprising:
   a layer stack comprising a plurality of first semiconductor layers of a first doping type and a plurality of second semiconductor layers of a second doping type complementary to the first doping type, the first semiconductor layers forming drift regions and the second semiconductor layers forming compensation regions of a superjunction transistor device;
   a first source region of the superjunction transistor device adjoining the plurality of first semiconductor layers;
   a first drain region of the superjunction transistor device adjoining the plurality of second semiconductor layers and spaced apart from the first source region in a first direction;
   a plurality of gate regions of the superjunction transistor device, wherein each of the plurality of gate regions adjoins at least one of the plurality of second semiconductor layers, is arranged between the first source region and the first drain region, and is spaced apart from the first source region and the first drain region;
   a third semiconductor layer different than and formed on the layer stack with an uppermost layer of the layer stack adjoining the third semiconductor layer, the third semiconductor layer also adjoining each of the first source region, the first drain region, and the plurality of gate regions; and
   active regions of a second transistor device integrated in the third semiconductor layer in a second region that is spaced apart from a first region of the third semiconductor layer, the first region being bordered by the first source region and the first drain region and having the second doping type,
   wherein a thickness of the third semiconductor layer is at least twice a thickness of a single one of the first semiconductor layers or a single one of the second semiconductor layers.

2. The transistor arrangement of claim 1, wherein a doping concentration of the first region of the third semiconductor layer is lower than a doping concentration of the plurality of second semiconductor layers.

3. The transistor arrangement of claim 1, wherein a doping concentration of the second region of the third semiconductor layer is higher than a doping concentration of the first region.

4. The transistor arrangement of claim 1, wherein the thickness of the third semiconductor layer is greater than a distance between the first source region and each of the gate regions.

5. The transistor arrangement of claim 1, wherein the first semiconductor layers and the second semiconductor layers are parallel to the third semiconductor layer.

6. The transistor arrangement of claim 1, wherein the first semiconductor layers and the second semiconductor layers are perpendicular to the third semiconductor layer.

7. The transistor arrangement of claim 1, wherein the active regions of the second transistor device comprise:
   a second source region of the first doping type;

a second drain region of the first doping type spaced apart from the second source region; and a body region of the second doping type adjoining the second source region and arranged between the second source region and the second drain region, wherein the second transistor device further comprises a gate electrode adjacent the body region and dielectrically insulated from the body region by a gate dielectric.

8. The transistor arrangement of claim 7, wherein the second transistor device further comprises a drift region of the first doping type arranged between the body region and the second drain region.

9. The transistor arrangement of claim 7, wherein the second source region is electrically connected to each of the gate regions.

10. The transistor arrangement of claim 1, further comprising a connection region of the second doping type, the connection region adjoining each of the second semiconductor layers and being connected to a source node of the second transistor device.

11. The transistor arrangement of claim 1, wherein the first source region, in a horizontal plane of the layer stack, forms a ring around the first drain region.

12. The transistor arrangement of claim 1, further comprising a carrier, wherein the layer stack is arranged on top of the carrier.

13. The transistor arrangement of claim 12, wherein each of the first source region, the gate regions and the first drain region extend through the third semiconductor layer and the layer stack to the carrier.

14. The transistor arrangement of claim 12, wherein the carrier comprises a first carrier region adjoining the first source region and a second carrier region adjoining the first drain region and separating the first drain region from the first carrier region, wherein a p-n junction is formed between first carrier region and the second carrier region.

15. The transistor arrangement of claim 12, wherein the carrier comprises an insulation layer.

16. The transistor arrangement of claim 15, wherein the carrier further comprises a semiconductor layer, and wherein the semiconductor layer adjoins the insulation layer at a side facing away from the layer stack.

17. The transistor arrangement of claim 16, wherein the insulation layer adjoins the layer stack.

18. The transistor arrangement of claim 15, wherein a semiconductor layer is arranged between the insulation layer and the layer stack.

19. The transistor arrangement of claim 1, further comprising an edge termination structure in or on top of the first region of the third semiconductor layer.

20. A method, comprising:

forming a semiconductor body on top of a carrier, the semiconductor body comprising a layer stack with a plurality of first layers of a first doping type and a plurality of second layers of a second doping type complementary to the first doping type, and a third layer different than and formed on top of the layer stack with an uppermost layer of the layer stack adjoining the third layer, the first layers forming drift regions and the second layers forming compensation regions of a superjunction transistor device;

forming a first source region of the superjunction transistor device such that the first source region adjoins the plurality of first layers;

forming a first drain region of the superjunction transistor device such that the first drain region adjoins the plurality of first layers and is spaced apart from the first source region in a first direction;

forming a plurality of gate regions of the superjunction transistor device such that each of the plurality of gate regions adjoins at least one of the plurality of second layers, is arranged between the first source region and the first drain region, and is spaced apart from the first source region and the first drain region; and forming active regions of a second transistor device in a second region of the third layer, the second region being spaced apart from a first region of the third layer, the first region being bordered by the first source region and the first drain region, wherein a thickness of the third layer is at least twice a thickness of a single one of the first layers or a single one of the second layers of the layer stack.

21. The method of claim 20, wherein forming the semiconductor body comprises one epitaxial growth process.

22. A transistor arrangement, comprising:

a layer stack comprising a plurality of first semiconductor layers of a first doping type and a plurality of second semiconductor layers of a second doping type complementary to the first doping type, the first semiconductor layers forming drift regions and the second semiconductor layers forming compensation regions of a superjunction transistor device;

a first source region of the superjunction transistor device adjoining the plurality of first semiconductor layers;

a first drain region of the superjunction transistor device adjoining the plurality of second semiconductor layers and spaced apart from the first source region in a first direction;

a plurality of gate regions of the superjunction transistor device, wherein each of the plurality of gate regions adjoins at least one of the plurality of second semiconductor layers, is arranged between the first source region and the first drain region, and is spaced apart from the first source region and the first drain region;

a third semiconductor layer different than and formed on the layer stack with an uppermost layer of the layer stack adjoining the third semiconductor layer, the third semiconductor layer also adjoining each of the first source region, the first drain region, and the plurality of gate regions; and active regions of a second transistor device integrated in the third semiconductor layer in a second region that is spaced apart from a first region of the third semiconductor layer, the first region being bordered by the first source region and the first drain region and having the second doping type, wherein a thickness of the third semiconductor layer is greater than a distance between the first source region and each of the gate regions.

* * * * *

UNITED STATES PATENT AND TRADEMARK OFFICE
CERTIFICATE OF CORRECTION

| | |
|---|---|
| PATENT NO. | : 11,245,002 B2 |
| APPLICATION NO. | : 16/230183 |
| DATED | : February 8, 2022 |
| INVENTOR(S) | : R. Weis et al. |

It is certified that error appears in the above-identified patent and that said Letters Patent is hereby corrected as shown below:

In the Claims

Column 27, Lines 37-38 Claim 14, change "between first" to -- between the first --

Signed and Sealed this
Nineteenth Day of April, 2022

Katherine Kelly Vidal
*Director of the United States Patent and Trademark Office*